(12) United States Patent
Andrews et al.

(10) Patent No.: US 7,940,069 B2
(45) Date of Patent: *May 10, 2011

(54) SYSTEM FOR TESTING SEMICONDUCTORS

(75) Inventors: Peter Andrews, Beaverton, OR (US); David Hess, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/653,574

(22) Filed: Dec. 15, 2009

(65) Prior Publication Data

US 2010/0097467 A1    Apr. 22, 2010

Related U.S. Application Data

(63) Continuation of application No. 11/335,069, filed on Jan. 18, 2006, now Pat. No. 7,656,172.

(60) Provisional application No. 60/648,952, filed on Jan. 31, 2005.

(51) Int. Cl.
  *G01R 31/02* (2006.01)
(52) U.S. Cl. .................................. 324/755.01
(58) Field of Classification Search ........................ None
See application file for complete search history.

(56) References Cited

U.S. PATENT DOCUMENTS

| | | | |
|---|---|---|---|
| 491,783 A | 2/1893 | Moyer | |
| 1,337,866 A | 4/1920 | Whitaker | |
| 2,142,625 A | 1/1939 | Zoethout | |
| 2,197,081 A | 4/1940 | Piron | |
| 2,376,101 A | 5/1945 | Tyzzer | |
| 2,389,668 A | 11/1945 | Johnson | |
| 2,471,897 A | 5/1949 | Rappl | |
| 2,545,258 A | 3/1951 | Cailloux | |
| 2,762,234 A | 9/1952 | Dodd | |
| 2,812,502 A | 11/1957 | Doherty | |
| 2,901,696 A | 8/1959 | Mollfors | |
| 2,921,276 A | 1/1960 | Fubini | |
| 3,176,091 A | 3/1965 | Hanson et al. | |
| 3,185,927 A | 5/1965 | Margulis et al. | |
| 3,192,844 A | 7/1965 | Szasz et al. | |
| 3,193,712 A | 7/1965 | Harris | |
| 3,201,721 A | 8/1965 | Voelcker | |
| 3,218,584 A | 11/1965 | Ayer | |
| 3,230,299 A | 1/1966 | Radziejowski | |

(Continued)

FOREIGN PATENT DOCUMENTS

CN     1083975     3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner* — Jermele M Hollington
(74) *Attorney, Agent, or Firm* — Chernoff, Vilhauer, McClung & Stenzel

(57) ABSTRACT

A testing system that includes an plural imaging devices capturing plural video sequences from a single optical path and concurrently displaying the video sequences for effectively positioning a probe for testing a semiconductor wafer.

10 Claims, 10 Drawing Sheets

U.S. PATENT DOCUMENTS

| | | |
|---|---|---|
| 3,256,484 A | 6/1966 | Terry |
| 3,262,593 A | 7/1966 | Hainer |
| 3,265,969 A | 8/1966 | Catu |
| 3,289,046 A | 11/1966 | Carr |
| 3,333,274 A | 7/1967 | Forcier |
| 3,396,598 A | 8/1968 | Grispo |
| 3,401,126 A | 9/1968 | Miller et al. |
| 3,405,361 A | 10/1968 | Kattner et al. |
| 3,408,585 A | 10/1968 | Frick et al. |
| 3,429,040 A | 2/1969 | Miller |
| 3,435,185 A | 3/1969 | Gerard |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed, Jr. et al. |
| 3,602,845 A | 8/1971 | Agrios et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,573 A | 4/1972 | Graham |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,775,644 A | 11/1973 | Cotner et al. |
| 3,777,260 A | 12/1973 | Davies et al. |
| 3,806,801 A | 4/1974 | Bove |
| 3,810,016 A | 5/1974 | Chayka et al. |
| 3,810,017 A | 5/1974 | Wiesler et al. |
| 3,814,888 A | 6/1974 | Bowers et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,863,181 A | 1/1975 | Glance et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,042,119 A | 8/1977 | Hassan et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,177,421 A | 12/1979 | Thornburg |
| 4,184,133 A | 1/1980 | Gehle |
| 4,184,729 A | 1/1980 | Parks et al. |
| 4,186,338 A | 1/1980 | Fichtenbaum |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,375,631 A | 3/1983 | Goldberg |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,663,840 A | 5/1987 | Ubbens et al. |
| 4,665,360 A | 5/1987 | Phillips |
| 4,669,805 A | 6/1987 | Kosugi et al. |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |

| Patent | Date | Inventor |
|---|---|---|
| 4,684,884 A | 8/1987 | Soderlund |
| 4,685,150 A | 8/1987 | Maier |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,696,544 A | 9/1987 | Costella |
| 4,697,143 A | 9/1987 | Lockwood et al. |
| 4,703,433 A | 10/1987 | Sharrit |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,712,370 A | 12/1987 | MacGee |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,730,158 A | 3/1988 | Kasai et al. |
| 4,731,577 A | 3/1988 | Logan |
| 4,734,641 A | 3/1988 | Byrd, Jr. et al. |
| 4,734,872 A | 3/1988 | Eager et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,757,550 A | 7/1988 | Uga |
| 4,758,785 A | 7/1988 | Rath |
| 4,759,712 A | 7/1988 | Demand |
| 4,764,723 A | 8/1988 | Strid |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |
| 4,818,059 A | 4/1989 | Kakii et al. |
| 4,818,169 A | 4/1989 | Schram et al. |
| 4,827,211 A | 5/1989 | Strid et al. |
| 4,831,494 A | 5/1989 | Arnold et al. |
| 4,835,495 A | 5/1989 | Simonutti |
| 4,837,507 A | 6/1989 | Hechtman |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |
| 4,853,613 A | 8/1989 | Sequeira et al. |
| 4,853,624 A | 8/1989 | Rabjohn |
| 4,853,627 A | 8/1989 | Gleason et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,896,109 A | 1/1990 | Rauscher |
| 4,899,126 A | 2/1990 | Yamada |
| 4,899,998 A | 2/1990 | Teramachi |
| 4,901,012 A | 2/1990 | Gloanec et al. |
| 4,904,933 A | 2/1990 | Snyder et al. |
| 4,904,935 A | 2/1990 | Calma et al. |
| 4,906,920 A | 3/1990 | Huff et al. |
| 4,908,570 A | 3/1990 | Gupta et al. |
| 4,912,399 A | 3/1990 | Greub et al. |
| 4,916,002 A | 4/1990 | Carver |
| 4,916,398 A | 4/1990 | Rath |
| 4,918,279 A | 4/1990 | Babel et al. |
| 4,918,373 A | 4/1990 | Newberg |
| 4,918,374 A | 4/1990 | Stewart et al. |
| 4,918,383 A | 4/1990 | Huff et al. |
| 4,922,128 A | 5/1990 | Dhong et al. |
| 4,922,186 A | 5/1990 | Tsuchiya et al. |
| 4,922,912 A | 5/1990 | Watanabe |
| 4,923,407 A | 5/1990 | Rice et al. |
| 4,926,118 A | 5/1990 | O'Connor et al. |
| 4,926,172 A | 5/1990 | Gorsek |
| 4,929,893 A | 5/1990 | Sato et al. |
| 4,933,634 A | 6/1990 | Cuzin et al. |
| 4,968,931 A | 11/1990 | Littlebury et al. |
| 4,970,386 A | 11/1990 | Buck |
| 4,972,073 A | 11/1990 | Lessing |
| 4,975,638 A | 12/1990 | Evans et al. |
| 4,978,907 A | 12/1990 | Smith |
| 4,978,914 A | 12/1990 | Akimoto et al. |
| 4,980,637 A | 12/1990 | Huff et al. |
| 4,982,153 A | 1/1991 | Collins et al. |
| 4,983,910 A | 1/1991 | Majidi-Ahy et al. |
| 4,987,100 A | 1/1991 | McBride et al. |
| 4,988,062 A | 1/1991 | London |
| 4,991,290 A | 2/1991 | MacKay |
| 4,994,737 A | 2/1991 | Carlton et al. |
| 4,998,062 A | 3/1991 | Ikeda |
| 4,998,063 A | 3/1991 | Miller |
| 5,001,423 A | 3/1991 | Abrami et al. |
| 5,003,253 A | 3/1991 | Majidi-Ahy et al. |
| 5,006,796 A | 4/1991 | Burton et al. |
| 5,010,296 A | 4/1991 | Okada et al. |
| 5,012,186 A | 4/1991 | Gleason |
| 5,019,692 A | 5/1991 | Nbedi et al. |
| 5,020,219 A | 6/1991 | Leedy |
| 5,021,186 A | 6/1991 | Ota et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,051,825 A | 9/1991 | Cochran et al. |
| 5,059,898 A | 10/1991 | Barsotti et al. |
| 5,061,192 A | 10/1991 | Chapin et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,069,628 A | 12/1991 | Crumly |
| 5,070,297 A | 12/1991 | Kwon et al. |
| 5,077,523 A | 12/1991 | Blanz |
| 5,082,627 A | 1/1992 | Stanbro |
| 5,084,671 A | 1/1992 | Miyata et al. |
| 5,089,774 A | 2/1992 | Nakano |
| 5,091,691 A | 2/1992 | Kamieniecki et al. |
| 5,091,732 A | 2/1992 | Mileski et al. |
| 5,095,891 A | 3/1992 | Reitter |
| 5,097,101 A | 3/1992 | Trobough |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,116,180 A | 5/1992 | Fung et al. |

| Patent No. | Date | Inventor |
|---|---|---|
| 5,126,286 A | 6/1992 | Chance |
| 5,126,696 A | 6/1992 | Grote et al. |
| 5,133,119 A | 7/1992 | Afshari et al. |
| 5,134,365 A | 7/1992 | Okubo et al. |
| 5,136,237 A | 8/1992 | Smith et al. |
| 5,138,289 A | 8/1992 | McGrath |
| 5,142,224 A | 8/1992 | Smith et al. |
| 5,144,228 A | 9/1992 | Sorna et al. |
| 5,145,552 A | 9/1992 | Yoshizawa et al. |
| 5,148,131 A | 9/1992 | Amboss et al. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,164,661 A | 11/1992 | Jones |
| 5,166,606 A | 11/1992 | Blanz |
| 5,172,049 A | 12/1992 | Kiyokawa et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,187,443 A | 2/1993 | Bereskin |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,202,648 A | 4/1993 | McCandless |
| 5,207,585 A | 5/1993 | Byrnes et al. |
| 5,209,088 A | 5/1993 | Vaks |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,227,730 A | 7/1993 | King et al. |
| 5,232,789 A | 8/1993 | Platz et al. |
| 5,233,197 A | 8/1993 | Bowman et al. |
| 5,233,306 A | 8/1993 | Misra |
| 5,237,267 A | 8/1993 | Harwood et al. |
| 5,245,292 A | 9/1993 | Milesky et al. |
| 5,266,889 A | 11/1993 | Harwood et al. |
| 5,266,963 A | 11/1993 | Carter |
| 5,267,088 A | 11/1993 | Nomura |
| 5,270,664 A | 12/1993 | McMurtry et al. |
| 5,274,336 A | 12/1993 | Crook et al. |
| 5,278,494 A | 1/1994 | Obigane |
| 5,280,156 A | 1/1994 | Niori et al. |
| 5,289,117 A | 2/1994 | Van Loan et al. |
| 5,293,175 A | 3/1994 | Hemmie et al. |
| 5,298,972 A | 3/1994 | Heffner |
| 5,303,938 A | 4/1994 | Miller et al. |
| 5,304,924 A | 4/1994 | Yamano et al. |
| 5,313,157 A | 5/1994 | Pasiecznik, Jr. |
| 5,315,237 A | 5/1994 | Iwakura et al. |
| 5,316,435 A | 5/1994 | Mozingo |
| 5,317,656 A | 5/1994 | Moslehi et al. |
| 5,321,352 A | 6/1994 | Takebuchi |
| 5,321,453 A | 6/1994 | Mori et al. |
| 5,325,052 A | 6/1994 | Yamashita |
| 5,326,412 A | 7/1994 | Schreiber et al. |
| 5,334,931 A | 8/1994 | Clarke et al. |
| 5,336,989 A | 8/1994 | Hofer |
| 5,345,170 A | 9/1994 | Schwindt et al. |
| 5,347,204 A | 9/1994 | Gregory et al. |
| 5,355,079 A | 10/1994 | Evans et al. |
| 5,357,211 A | 10/1994 | Bryson et al. |
| 5,360,312 A | 11/1994 | Mozingo |
| 5,361,049 A | 11/1994 | Rubin et al. |
| 5,363,050 A | 11/1994 | Guo et al. |
| 5,367,165 A | 11/1994 | Toda et al. |
| 5,369,368 A | 11/1994 | Kassen et al. |
| 5,369,370 A | 11/1994 | Stratmann et al. |
| 5,371,457 A | 12/1994 | Lipp |
| 5,371,654 A | 12/1994 | Beaman et al. |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,383,787 A | 1/1995 | Switky et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,430,813 A | 7/1995 | Anderson et al. |
| 5,434,512 A | 7/1995 | Schwindt et al. |
| 5,441,690 A | 8/1995 | Ayala-Esquilin et al. |
| 5,448,172 A | 9/1995 | Dechene et al. |
| 5,451,884 A | 9/1995 | Sauerland |
| 5,453,404 A | 9/1995 | Leedy |
| 5,457,398 A | 10/1995 | Schwindt et al. |
| 5,461,328 A | 10/1995 | Devereaux et al. |
| 5,463,324 A | 10/1995 | Wardwell et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,487,999 A | 1/1996 | Farnworth |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,507,652 A | 4/1996 | Wardwell |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,532,609 A | 7/1996 | Harwood et al. |
| 5,537,372 A | 7/1996 | Albrecht et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,481 A | 8/1996 | Holmes et al. |
| 5,550,482 A | 8/1996 | Sano |
| 5,552,716 A | 9/1996 | Takahashi et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |

| | | | | | |
|---|---|---|---|---|---|
| 5,584,120 A | 12/1996 | Roberts | 5,804,983 A | 9/1998 | Nakajima et al. |
| 5,584,608 A | 12/1996 | Gillespie | 5,806,181 A | 9/1998 | Khandros et al. |
| 5,589,781 A | 12/1996 | Higgins et al. | 5,807,107 A | 9/1998 | Bright et al. |
| 5,594,358 A | 1/1997 | Ishikawa et al. | 5,810,607 A | 9/1998 | Shih et al. |
| 5,600,256 A | 2/1997 | Woith et al. | 5,811,751 A | 9/1998 | Leona et al. |
| 5,601,740 A | 2/1997 | Eldridge et al. | 5,811,982 A | 9/1998 | Beaman et al. |
| 5,604,444 A | 2/1997 | Harwood et al. | 5,813,847 A | 9/1998 | Eroglu et al. |
| 5,610,529 A | 3/1997 | Schwindt | 5,814,847 A | 9/1998 | Shihadeh et al. |
| 5,611,008 A | 3/1997 | Yap | 5,820,014 A | 10/1998 | Dozier, II et al. |
| 5,611,946 A | 3/1997 | Leong et al. | 5,821,763 A | 10/1998 | Beaman et al. |
| 5,617,035 A | 4/1997 | Swapp | 5,824,494 A | 10/1998 | Feldberg |
| 5,621,333 A | 4/1997 | Long et al. | 5,828,225 A | 10/1998 | Obikane et al. |
| 5,621,400 A | 4/1997 | Corbi | 5,829,128 A | 11/1998 | Eldridge et al. |
| 5,623,213 A | 4/1997 | Liu et al. | 5,829,437 A | 11/1998 | Bridges |
| 5,623,214 A | 4/1997 | Pasiecznik, Jr. | 5,831,442 A | 11/1998 | Heigl |
| 5,627,473 A | 5/1997 | Takami | 5,832,601 A | 11/1998 | Eldridge et al. |
| 5,628,057 A | 5/1997 | Phillips et al. | 5,833,601 A | 11/1998 | Swartz et al. |
| 5,629,631 A | 5/1997 | Perry et al. | 5,835,997 A | 11/1998 | Yassine |
| 5,629,838 A | 5/1997 | Knight et al. | 5,838,160 A | 11/1998 | Beaman et al. |
| 5,631,571 A | 5/1997 | Spaziani et al. | 5,838,161 A | 11/1998 | Akram et al. |
| 5,633,780 A | 5/1997 | Cronin | 5,841,288 A | 11/1998 | Meaney et al. |
| 5,635,846 A | 6/1997 | Beaman et al. | 5,841,342 A | 11/1998 | Hegmann et al. |
| 5,640,101 A | 6/1997 | Kuji et al. | 5,846,708 A | 12/1998 | Hollis et al. |
| 5,642,298 A | 6/1997 | Mallory et al. | 5,847,569 A | 12/1998 | Ho et al. |
| 5,644,248 A | 7/1997 | Fujimoto | 5,848,500 A | 12/1998 | Kirk |
| 5,646,538 A | 7/1997 | Lide et al. | 5,852,232 A | 12/1998 | Samsavar et al. |
| 5,653,939 A | 8/1997 | Hollis et al. | 5,852,871 A | 12/1998 | Khandros |
| 5,656,942 A | 8/1997 | Watts et al. | 5,854,608 A | 12/1998 | Leisten |
| 5,657,394 A | 8/1997 | Schwartz et al. | 5,857,667 A | 1/1999 | Lee |
| 5,659,255 A | 8/1997 | Strid et al. | 5,861,743 A | 1/1999 | Pye et al. |
| 5,659,421 A | 8/1997 | Rahmel et al. | 5,864,946 A | 2/1999 | Eldridge et al. |
| 5,663,653 A | 9/1997 | Schwindt et al. | 5,867,073 A | 2/1999 | Weinreb et al. |
| 5,666,063 A | 9/1997 | Abercrombie et al. | 5,869,326 A | 2/1999 | Hofmann |
| 5,668,470 A | 9/1997 | Shelor | 5,869,974 A | 2/1999 | Akram et al. |
| 5,669,316 A | 9/1997 | Faz et al. | 5,869,975 A | 2/1999 | Strid et al. |
| 5,670,322 A | 9/1997 | Eggers et al. | 5,874,361 A | 2/1999 | Collins et al. |
| 5,670,888 A | 9/1997 | Cheng | 5,876,082 A | 3/1999 | Kempf et al. |
| 5,672,816 A | 9/1997 | Park et al. | 5,878,486 A | 3/1999 | Eldridge et al. |
| 5,675,499 A | 10/1997 | Lee et al. | 5,879,289 A | 3/1999 | Yarush et al. |
| 5,675,932 A | 10/1997 | Mauney | 5,880,772 A | 3/1999 | Kalnajs et al. |
| 5,676,360 A | 10/1997 | Boucher et al. | 5,883,522 A | 3/1999 | O'Boyle |
| 5,678,210 A | 10/1997 | Hannah | 5,883,523 A | 3/1999 | Ferland et al. |
| 5,680,039 A | 10/1997 | Mochizuki et al. | 5,884,398 A | 3/1999 | Eldridge et al. |
| 5,682,337 A | 10/1997 | El-Fishaway et al. | 5,888,075 A | 3/1999 | Hasegawa et al. |
| 5,685,232 A | 11/1997 | Inoue | 5,892,539 A | 4/1999 | Colvin |
| 5,686,317 A | 11/1997 | Akram et al. | 5,896,038 A | 4/1999 | Budnaitis et al. |
| 5,686,960 A | 11/1997 | Sussman et al. | 5,900,737 A | 5/1999 | Graham et al. |
| 5,688,618 A | 11/1997 | Hulderman et al. | 5,900,738 A | 5/1999 | Khandros et al. |
| 5,700,844 A | 12/1997 | Hederick et al. | 5,903,143 A | 5/1999 | Mochizuki et al. |
| 5,704,355 A | 1/1998 | Bridges | 5,905,421 A | 5/1999 | Oldfield |
| 5,712,571 A | 1/1998 | O'Donoghue | 5,910,727 A | 6/1999 | Fujihara et al. |
| 5,715,819 A | 2/1998 | Svenson et al. | 5,912,046 A | 6/1999 | Eldridge et al. |
| 5,720,098 A | 2/1998 | Kister | 5,914,613 A | 6/1999 | Gleason et al. |
| 5,723,347 A | 3/1998 | Kirano et al. | 5,914,614 A | 6/1999 | Beaman et al. |
| 5,726,211 A | 3/1998 | Hedrick et al. | 5,916,689 A | 6/1999 | Collins et al. |
| 5,728,091 A | 3/1998 | Payne et al. | 5,917,707 A | 6/1999 | Khandros et al. |
| 5,729,150 A | 3/1998 | Schwindt | 5,923,177 A | 7/1999 | Wardwell |
| 5,731,708 A | 3/1998 | Sobhami | 5,923,180 A | 7/1999 | Botka et al. |
| 5,731,920 A | 3/1998 | Katsuragawa | 5,926,028 A | 7/1999 | Mochizuki |
| 5,742,174 A | 4/1998 | Kister et al. | 5,926,029 A | 7/1999 | Ference et al. |
| 5,744,971 A | 4/1998 | Chan et al. | 5,926,951 A | 7/1999 | Khandros et al. |
| 5,748,506 A | 5/1998 | Bockelman | 5,942,907 A | 8/1999 | Chiang |
| 5,751,252 A | 5/1998 | Phillips | 5,944,093 A | 8/1999 | Viswanath |
| 5,756,021 A | 5/1998 | Bedrick et al. | 5,945,836 A | 8/1999 | Sayre et al. |
| 5,756,908 A | 5/1998 | Knollmeyer et al. | 5,949,383 A | 9/1999 | Hayes et al. |
| 5,767,690 A | 6/1998 | Fujimoto | 5,949,579 A | 9/1999 | Baker |
| 5,772,451 A | 6/1998 | Dozier, II et al. | 5,952,842 A | 9/1999 | Fujimoto |
| 5,773,780 A | 6/1998 | Eldridge et al. | 5,959,461 A | 9/1999 | Brown et al. |
| 5,773,951 A | 6/1998 | Markowski et al. | 5,960,411 A | 9/1999 | Hartman et al. |
| 5,777,485 A | 7/1998 | Tanaka et al. | 5,963,027 A | 10/1999 | Peters |
| 5,785,538 A | 7/1998 | Beaman et al. | 5,963,364 A | 10/1999 | Leong et al. |
| 5,792,668 A | 8/1998 | Fuller et al. | 5,966,645 A | 10/1999 | Davis |
| 5,793,213 A | 8/1998 | Bockelman et al. | 5,970,429 A | 10/1999 | Martin |
| 5,794,133 A | 8/1998 | Kashima | 5,973,504 A | 10/1999 | Chong |
| 5,798,652 A | 8/1998 | Taraci | 5,973,505 A | 10/1999 | Strid et al. |
| 5,802,856 A | 9/1998 | Schaper et al. | 5,974,662 A | 11/1999 | Eldridge et al. |
| 5,803,607 A | 9/1998 | Jones et al. | 5,981,268 A | 11/1999 | Kovacs et al. |
| 5,804,607 A | 9/1998 | Hedrick et al. | 5,982,166 A | 11/1999 | Mautz |
| 5,804,982 A | 9/1998 | Lo et al. | 5,983,493 A | 11/1999 | Eldridge et al. |

| | | | | | | |
|---|---|---|---|---|---|---|
| 5,993,611 | A | 11/1999 | Moroney, III et al. | 6,147,851 A | 11/2000 | Anderson |
| 5,994,152 | A | 11/1999 | Khandros et al. | 6,150,186 A | 11/2000 | Chen et al. |
| 5,995,914 | A | 11/1999 | Cabot | 6,160,407 A | 12/2000 | Nikawa |
| 5,996,102 | A | 11/1999 | Haulin | 6,166,553 A | 12/2000 | Sinsheimer |
| 5,998,228 | A | 12/1999 | Eldridge et al. | 6,168,974 B1 | 1/2001 | Chang et al. |
| 5,998,768 | A | 12/1999 | Hunter et al. | 6,169,410 B1 | 1/2001 | Grace et al. |
| 5,998,864 | A | 12/1999 | Khandros et al. | 6,172,337 B1 | 1/2001 | Johnsgard et al. |
| 5,999,268 | A | 12/1999 | Yonezawa et al. | 6,174,744 B1 | 1/2001 | Watanabe et al. |
| 6,001,760 | A | 12/1999 | Katsuda et al. | 6,175,228 B1 | 1/2001 | Zamborelli et al. |
| 6,002,236 | A | 12/1999 | Trant et al. | 6,176,091 B1 | 1/2001 | Kishi et al. |
| 6,002,263 | A | 12/1999 | Peters et al. | 6,181,144 B1 | 1/2001 | Hembree et al. |
| 6,002,426 | A | 12/1999 | Back et al. | 6,181,149 B1 | 1/2001 | Godfrey et al. |
| 6,005,579 | A | 12/1999 | Sugiyama et al. | 6,181,297 B1 | 1/2001 | Leisten |
| 6,006,002 | A | 12/1999 | Motok et al. | 6,181,416 B1 | 1/2001 | Falk |
| 6,013,586 | A | 1/2000 | McGhee et al. | 6,184,053 B1 | 2/2001 | Eldridge et al. |
| 6,019,612 | A | 2/2000 | Hasegawa et al. | 6,184,587 B1 | 2/2001 | Khandros et al. |
| 6,023,103 | A | 2/2000 | Chang et al. | 6,184,845 B1 | 2/2001 | Leisten et al. |
| 6,023,209 | A | 2/2000 | Faulkner et al. | 6,191,596 B1 | 2/2001 | Abiko |
| 6,028,435 | A | 2/2000 | Nikawa | 6,194,720 B1 | 2/2001 | Li et al. |
| 6,029,141 | A | 2/2000 | Bezos et al. | 6,194,907 B1 | 2/2001 | Kanao et al. |
| 6,029,344 | A | 2/2000 | Khandros et al. | 6,198,299 B1 | 3/2001 | Hollman |
| 6,031,383 | A | 2/2000 | Streib et al. | 6,206,273 B1 | 3/2001 | Beaman et al. |
| 6,031,384 | A | 2/2000 | Streib et al. | 6,208,225 B1 | 3/2001 | Miller |
| 6,032,356 | A | 3/2000 | Eldridge et al. | RE37,130 E | 4/2001 | Fiori, Jr. |
| 6,032,714 | A | 3/2000 | Fenton | 6,211,663 B1 | 4/2001 | Moulthrop et al. |
| 6,033,935 | A | 3/2000 | Dozier, II et al. | 6,211,837 B1 | 4/2001 | Crouch et al. |
| 6,034,533 | A | 3/2000 | Tervo et al. | 6,215,196 B1 | 4/2001 | Eldridge et al. |
| 6,037,785 | A | 3/2000 | Higgins | 6,215,295 B1 | 4/2001 | Smith, III |
| 6,037,793 | A | 3/2000 | Miyazawa et al. | 6,215,670 B1 | 4/2001 | Khandros |
| 6,040,739 | A | 3/2000 | Wedeen et al. | 6,218,910 B1 | 4/2001 | Miller |
| 6,042,712 | A | 3/2000 | Mathieu | 6,222,031 B1 | 4/2001 | Wakabayashi et al. |
| 6,043,563 | A | 3/2000 | Eldridge et al. | 6,222,970 B1 | 4/2001 | Wach et al. |
| 6,043,667 | A | 3/2000 | Cadwallader et al. | 6,229,327 B1 | 5/2001 | Boll et al. |
| 6,046,599 | A | 4/2000 | Long et al. | 6,232,149 B1 | 5/2001 | Dozier, II et al. |
| 6,049,216 | A | 4/2000 | Yang et al. | 6,232,787 B1 | 5/2001 | Lo et al. |
| 6,049,976 | A | 4/2000 | Khandros | 6,232,788 B1 | 5/2001 | Schwindt et al. |
| 6,050,829 | A | 4/2000 | Eldridge et al. | 6,232,789 B1 | 5/2001 | Schwindt |
| 6,051,422 | A | 4/2000 | Kovacs et al. | 6,232,790 B1 | 5/2001 | Bryan et al. |
| 6,052,653 | A | 4/2000 | Mazur et al. | 6,233,613 B1 | 5/2001 | Walker et al. |
| 6,054,651 | A | 4/2000 | Fogel et al. | 6,236,223 B1 | 5/2001 | Brady et al. |
| 6,054,869 | A | 4/2000 | Hutton et al. | 6,236,975 B1 | 5/2001 | Boe et al. |
| 6,059,982 | A | 5/2000 | Palagonia et al. | 6,236,977 B1 | 5/2001 | Verba et al. |
| 6,060,888 | A | 5/2000 | Blackham et al. | 6,242,803 B1 | 6/2001 | Khandros et al. |
| 6,060,891 | A | 5/2000 | Hembree et al. | 6,242,929 B1 | 6/2001 | Mizuta |
| 6,060,892 | A | 5/2000 | Yamagata | 6,245,692 B1 | 6/2001 | Pearce et al. |
| 6,061,589 | A | 5/2000 | Bridges et al. | 6,246,247 B1 | 6/2001 | Eldridge et al. |
| 6,062,879 | A | 5/2000 | Beaman et al. | 6,251,595 B1 | 6/2001 | Gordon et al. |
| 6,064,213 | A | 5/2000 | Khandros et al. | 6,252,392 B1 | 6/2001 | Peters |
| 6,064,217 | A | 5/2000 | Smith | 6,255,126 B1 | 7/2001 | Mathiue et al. |
| 6,064,218 | A | 5/2000 | Godfrey et al. | 6,256,882 B1 | 7/2001 | Gleason et al. |
| 6,066,911 | A | 5/2000 | Lindemann et al. | 6,257,319 B1 | 7/2001 | Kainuma et al. |
| 6,071,009 | A | 6/2000 | Clyne | 6,257,564 B1 | 7/2001 | Avneri et al. |
| 6,078,183 | A | 6/2000 | Cole, Jr. | 6,257,565 B1 | 7/2001 | Houston et al. |
| 6,078,500 | A | 6/2000 | Beaman et al. | 6,259,261 B1 | 7/2001 | Engelking et al. |
| 6,090,261 | A | 7/2000 | Mathieu | 6,265,950 B1 | 7/2001 | Schmidt et al. |
| 6,091,236 | A | 7/2000 | Piety et al. | 6,268,015 B1 | 7/2001 | Mathieu et al. |
| 6,091,255 | A | 7/2000 | Godfrey | 6,268,016 B1 | 7/2001 | Bhatt et al. |
| 6,091,256 | A | 7/2000 | Long et al. | 6,271,673 B1 | 8/2001 | Furuta et al. |
| 6,096,567 | A | 8/2000 | Kaplan et al. | 6,274,823 B1 | 8/2001 | Khandros et al. |
| 6,100,815 | A | 8/2000 | Pailthorp | 6,275,043 B1 | 8/2001 | Muhlberger et al. |
| 6,104,201 | A | 8/2000 | Beaman et al. | 6,275,738 B1 | 8/2001 | Kasevich et al. |
| 6,104,203 | A | 8/2000 | Costello et al. | 6,278,051 B1 | 8/2001 | Peabody |
| 6,104,206 | A | 8/2000 | Verkuil | 6,278,411 B1 | 8/2001 | Ohlsson et al. |
| 6,110,823 | A | 8/2000 | Eldridge et al. | 6,281,691 B1 | 8/2001 | Matsunaga et al. |
| 6,111,419 | A | 8/2000 | Lefever et al. | 6,284,971 B1 | 9/2001 | Atalar et al. |
| 6,114,864 | A | 9/2000 | Soejima et al. | 6,286,208 B1 | 9/2001 | Shih et al. |
| 6,114,865 | A | 9/2000 | Lagowski et al. | 6,288,557 B1 | 9/2001 | Peters et al. |
| 6,118,287 | A | 9/2000 | Boll et al. | 6,292,760 B1 | 9/2001 | Burns |
| 6,118,894 | A | 9/2000 | Schwartz et al. | 6,295,729 B1 | 10/2001 | Beaman et al. |
| 6,121,783 | A | 9/2000 | Horner et al. | 6,300,775 B1 | 10/2001 | Peach et al. |
| 6,124,723 | A | 9/2000 | Costello | 6,300,780 B1 | 10/2001 | Beaman et al. |
| 6,124,725 | A | 9/2000 | Sato | 6,307,161 B1 | 10/2001 | Grube et al. |
| 6,127,831 | A | 10/2000 | Khoury et al. | 6,307,363 B1 | 10/2001 | Anderson |
| 6,130,536 | A | 10/2000 | Powell et al. | 6,307,672 B1 | 10/2001 | DeNure |
| 6,130,544 | A | 10/2000 | Strid et al. | 6,310,483 B1 | 10/2001 | Taura et al. |
| 6,137,302 | A | 10/2000 | Schwindt | 6,310,755 B1 | 10/2001 | Kholodenko et al. |
| 6,137,303 | A | 10/2000 | Deckert et al. | 6,313,649 B2 | 11/2001 | Harwood et al. |
| 6,144,212 | A | 11/2000 | Mizuta | 6,320,372 B1 | 11/2001 | Keller |
| 6,147,502 | A | 11/2000 | Fryer et al. | 6,320,396 B1 | 11/2001 | Nikawa |

| Patent | Date | Inventor |
|---|---|---|
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,335,628 B2 | 1/2002 | Schwindt et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,636 B1 | 3/2002 | Peters et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,380,751 B2 | 4/2002 | Harwood et al. |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,560 B1 | 6/2002 | Walraven et al. |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,141 B1 | 7/2002 | Hollman et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,445,202 B1 | 9/2002 | Cowan et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,469,746 B1 | 10/2002 | Maida |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Naylor et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,491,968 B1 | 12/2002 | Mathieu et al. |
| 6,492,822 B2 | 12/2002 | Schwindt et al. |
| 6,496,024 B2 | 12/2002 | Schwindt |
| 6,499,121 B1 | 12/2002 | Roy et al. |
| 6,501,289 B1 | 12/2002 | Takekoshi |
| 6,501,343 B2 | 12/2002 | Miller |
| 6,509,751 B1 | 1/2003 | Mathieu et al. |
| 6,512,482 B1 | 1/2003 | Nelson et al. |
| 6,515,494 B1 | 2/2003 | Low |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,026 B1 | 4/2003 | Dibattista et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,608,496 B1 | 8/2003 | Strid et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,624,891 B2 | 9/2003 | Marcus et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mahltretter |
| 6,639,415 B2 | 10/2003 | Peters et al. |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,642,732 B2 | 11/2003 | Cowan et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,753 B1 | 2/2004 | Kitahata |
| 6,686,754 B2 | 2/2004 | Miller |
| 6,690,185 B1 | 2/2004 | Khandros et al. |
| 6,693,518 B2 | 2/2004 | Kumata et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |

| | | |
|---|---|---|
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,720,782 B2 | 4/2004 | Schwindt et al. |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge et al. |
| 6,765,609 B1 | 7/2004 | Kinoshita |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,319 B2 | 8/2004 | Grube et al. |
| 6,777,964 B2 | 8/2004 | Navratil et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,791,344 B2 | 9/2004 | Cook et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,582 B2 | 12/2004 | Morris et al. |
| 6,835,898 B2 | 12/2004 | Eldridge et al. |
| 6,836,135 B2 | 12/2004 | Harris et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,842,024 B2 | 1/2005 | Peters et al. |
| 6,843,024 B2 | 1/2005 | Nozaki et al. |
| 6,845,491 B2 | 1/2005 | Miller et al. |
| 6,847,219 B1 | 1/2005 | Lesher et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,861,856 B2 | 3/2005 | Dunklee et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,873,167 B2 | 3/2005 | Goto et al. |
| 6,882,239 B2 | 4/2005 | Miller |
| 6,882,546 B2 | 4/2005 | Miller |
| 6,885,197 B2 | 4/2005 | Harris et al. |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |

| | | | | | | |
|---|---|---|---|---|---|---|
| 7,002,364 | B2 | 2/2006 | Kang et al. | 2002/0118034 A1 | 8/2002 | Laureanti |
| 7,003,184 | B2 | 2/2006 | Ronnekleiv et al. | 2002/0149377 A1 | 10/2002 | Hefti et al. |
| 7,005,842 | B2 | 2/2006 | Fink et al. | 2002/0153909 A1 | 10/2002 | Petersen et al. |
| 7,005,868 | B2 | 2/2006 | McTigue | 2002/0163769 A1 | 11/2002 | Brown |
| 7,005,879 | B1 | 2/2006 | Robertazzi | 2002/0168659 A1 | 11/2002 | Hefti et al. |
| 7,006,046 | B2 | 2/2006 | Aisenbrey | 2002/0176160 A1 | 11/2002 | Suzuki et al. |
| 7,007,380 | B2 | 3/2006 | Das et al. | 2002/0180466 A1 | 12/2002 | Hiramatsu et al. |
| 7,009,188 | B2 | 3/2006 | Wang | 2002/0197709 A1 | 12/2002 | Van der Weide et al. |
| 7,009,383 | B2 | 3/2006 | Harwood et al. | 2003/0010877 A1 | 1/2003 | Landreville et al. |
| 7,009,415 | B2 | 3/2006 | Kobayashi et al. | 2003/0030822 A1 | 2/2003 | Finarov |
| 7,011,531 | B2 | 3/2006 | Egitto et al. | 2003/0032000 A1 | 2/2003 | Liu et al. |
| 7,012,425 | B2 | 3/2006 | Shoji | 2003/0040004 A1 | 2/2003 | Hefti et al. |
| 7,012,441 | B2 | 3/2006 | Chou et al. | 2003/0057513 A1 | 3/2003 | Leedy |
| 7,013,221 | B1 | 3/2006 | Friend et al. | 2003/0062915 A1 | 4/2003 | Arnold et al. |
| 7,014,499 | B2 | 3/2006 | Yoon | 2003/0071631 A1 | 4/2003 | Alexander |
| 7,015,455 | B2 | 3/2006 | Mitsuoka et al. | 2003/0072549 A1 | 4/2003 | Facer et al. |
| 7,015,689 | B2 | 3/2006 | Kasajima et al. | 2003/0076585 A1 | 4/2003 | Ledley |
| 7,015,690 | B2 | 3/2006 | Wang et al. | 2003/0077649 A1 | 4/2003 | Cho et al. |
| 7,015,703 | B2 | 3/2006 | Hopkins et al. | 2003/0088180 A1 | 5/2003 | VanVeen et al. |
| 7,015,707 | B2 | 3/2006 | Cherian | 2003/0119057 A1 | 6/2003 | Gascoyne et al. |
| 7,015,708 | B2 | 3/2006 | Beckous et al. | 2003/0139662 A1 | 7/2003 | Siedman |
| 7,015,709 | B2 | 3/2006 | Capps et al. | 2003/0139790 A1 | 7/2003 | Ingle et al. |
| 7,015,710 | B2 | 3/2006 | Yoshida et al. | 2003/0141861 A1 | 7/2003 | Navratil et al. |
| 7,015,711 | B2 | 3/2006 | Rothaug et al. | 2003/0155939 A1 | 8/2003 | Lutz et al. |
| 7,019,541 | B2 | 3/2006 | Kittrell | 2003/0170898 A1 | 9/2003 | Gunderson et al. |
| 7,019,544 | B1 | 3/2006 | Jacobs et al. | 2003/0184332 A1 | 10/2003 | Tomimatsu et al. |
| 7,019,701 | B2 | 3/2006 | Ohno et al. | 2004/0015060 A1 | 1/2004 | Samsoondar et al. |
| 7,020,360 | B2 | 3/2006 | Satomura et al. | 2004/0021475 A1 | 2/2004 | Ito et al. |
| 7,020,363 | B2 | 3/2006 | Johannessen | 2004/0061514 A1 | 4/2004 | Schwindt et al. |
| 7,022,976 | B1 | 4/2006 | Santana, Jr. et al. | 2004/0066181 A1 | 4/2004 | Thies |
| 7,022,985 | B2 | 4/2006 | Knebel et al. | 2004/0069776 A1 | 4/2004 | Fagrell et al. |
| 7,023,225 | B2 | 4/2006 | Blackwood | 2004/0075837 A1 | 4/2004 | Maeda et al. |
| 7,023,226 | B2 | 4/2006 | Okumura et al. | 2004/0090223 A1 | 5/2004 | Yonezawa |
| 7,023,229 | B2 | 4/2006 | Maesaki et al. | 2004/0095145 A1 | 5/2004 | Boudiaf et al. |
| 7,023,231 | B2 | 4/2006 | Howland, Jr. et al. | 2004/0095641 A1 | 5/2004 | Russum et al. |
| 7,025,628 | B2 | 4/2006 | LaMeres et al. | 2004/0100276 A1 | 5/2004 | Fanton |
| 7,026,832 | B2 | 4/2006 | Chaya et al. | 2004/0100297 A1 | 5/2004 | Tanioka et al. |
| 7,026,833 | B2 | 4/2006 | Rincon et al. | 2004/0108847 A1 | 6/2004 | Stoll et al. |
| 7,026,834 | B2 | 4/2006 | Hwang | 2004/0113639 A1 | 6/2004 | Dunklee et al. |
| 7,026,835 | B2 | 4/2006 | Farnworth et al. | 2004/0113640 A1 | 6/2004 | Cooper et al. |
| 7,030,599 | B2 | 4/2006 | Douglas | 2004/0130787 A1 | 7/2004 | Thome-Forster et al. |
| 7,030,827 | B2 | 4/2006 | Mahler et al. | 2004/0132222 A1 | 7/2004 | Hembree et al. |
| 7,032,307 | B2 | 4/2006 | Matsunaga et al. | 2004/0134899 A1 | 7/2004 | Hiramatsu et al. |
| 7,034,553 | B2 | 4/2006 | Gilboe | 2004/0147034 A1 | 7/2004 | Gore et al. |
| 7,035,738 | B2 | 4/2006 | Matsumoto et al. | 2004/0162689 A1 | 8/2004 | Jamneala et al. |
| 7,088,981 | B2 | 8/2006 | Chang | 2004/0170312 A1 | 9/2004 | Soenksen |
| 7,096,133 | B1 | 8/2006 | Martin et al. | 2004/0175294 A1 | 9/2004 | Ellison et al. |
| 7,101,797 | B2 | 9/2006 | Yuasa | 2004/0186382 A1 | 9/2004 | Modell et al. |
| 7,161,363 | B2 | 1/2007 | Gleason et al. | 2004/0193382 A1 | 9/2004 | Adamian et al. |
| 7,187,188 | B2 | 3/2007 | Andrews et al. | 2004/0197771 A1 | 10/2004 | Powers et al. |
| 7,188,037 | B2 | 3/2007 | Hidehira | 2004/0199350 A1 | 10/2004 | Blackham et al. |
| 7,417,445 | B2 | 8/2008 | Sakagawa et al. | 2004/0201388 A1 | 10/2004 | Barr |
| 7,535,247 | B2 | 5/2009 | Andrews et al. | 2004/0207072 A1 | 10/2004 | Hiramatsu et al. |
| 7,656,172 | B2 * | 2/2010 | Andrews et al. ............ 324/754 | 2004/0207424 A1 | 10/2004 | Hollman |
| 7,688,091 | B2 * | 3/2010 | Andrews et al. ......... 324/756.01 | 2004/0239338 A1 | 12/2004 | Jojnsson et al. |
| 2001/0002794 | A1 | 6/2001 | Draving et al. | 2004/0246004 A1 | 12/2004 | Heuermann |
| 2001/0009061 | A1 | 7/2001 | Gleason et al. | 2004/0251922 A1 | 12/2004 | Martens et al. |
| 2001/0009377 | A1 | 7/2001 | Schwindt et al. | 2005/0024069 A1 | 2/2005 | Hayden et al. |
| 2001/0010468 | A1 | 8/2001 | Gleason et al. | 2005/0026276 A1 | 2/2005 | Chou |
| 2001/0020283 | A1 | 9/2001 | Sakaguchi | 2005/0030047 A1 | 2/2005 | Adamian |
| 2001/0024116 | A1 | 9/2001 | Draving | 2005/0054029 A1 | 3/2005 | Tomimatsu et al. |
| 2001/0030549 | A1 | 10/2001 | Gleason et al. | 2005/0062533 A1 | 3/2005 | Vice |
| 2001/0043073 | A1 | 11/2001 | Montoya | 2005/0083130 A1 | 4/2005 | Grilo |
| 2001/0044152 | A1 | 11/2001 | Burnett | 2005/0099192 A1 | 5/2005 | Dunklee et al. |
| 2001/0045511 | A1 | 11/2001 | Moore et al. | 2005/0101846 A1 | 5/2005 | Fine et al. |
| 2001/0054906 | A1 | 12/2001 | Fujimura | 2005/0156675 A1 | 7/2005 | Rohde et al. |
| 2002/0005728 | A1 | 1/2002 | Babson et al. | 2005/0164160 A1 | 7/2005 | Gunter et al. |
| 2002/0008533 | A1 | 1/2002 | Ito et al. | 2005/0165316 A1 | 7/2005 | Lowery et al. |
| 2002/0009377 | A1 | 1/2002 | Shafer | 2005/0168722 A1 | 8/2005 | Forstner et al. |
| 2002/0009378 | A1 | 1/2002 | Obara | 2005/0174191 A1 | 8/2005 | Brunker et al. |
| 2002/0011859 | A1 | 1/2002 | Smith et al. | 2005/0178980 A1 | 8/2005 | Skidmore et al. |
| 2002/0011863 | A1 | 1/2002 | Takahashi et al. | 2005/0195124 A1 | 9/2005 | Puente Baliarda et al. |
| 2002/0050828 | A1 | 5/2002 | Seward, IV et al. | 2005/0227503 A1 | 10/2005 | Reitinger |
| 2002/0070743 | A1 | 6/2002 | Felici et al. | 2005/0236587 A1 | 10/2005 | Kodama et al. |
| 2002/0070745 | A1 | 6/2002 | Johnson et al. | 2005/0237102 A1 | 10/2005 | Tanaka |
| 2002/0075027 | A1 | 6/2002 | Hollman et al. | 2006/0030060 A1 | 2/2006 | Noguchi et al. |
| 2002/0079911 | A1 | 6/2002 | Schwindt | 2006/0052075 A1 | 3/2006 | Galivanche et al. |
| 2002/0109088 | A1 | 8/2002 | Nara et al. | 2006/0092505 A1 | 5/2006 | Abnet et al. |
| 2002/0118009 | A1 | 8/2002 | Hollman et al. | 2006/0114012 A1 | 6/2006 | Reitinger |

| | | | | | | |
|---|---|---|---|---|---|---|
| 2006/0155270 | A1 | 7/2006 | Hancock et al. | JP | 63-129640 | 6/1988 |
| 2006/0158207 | A1 | 7/2006 | Reitinger | JP | 63-143814 | 6/1988 |
| 2006/0169897 | A1 | 8/2006 | Andrews et al. | JP | 63-160355 | 7/1988 |
| 2006/0184041 | A1 | 8/2006 | Andrews et al. | JP | 63-318745 | 12/1988 |
| 2006/0226864 | A1 | 10/2006 | Kramer | JP | 1-165968 | 6/1989 |
| 2007/0024506 | A1 | 2/2007 | Hardacker | JP | 1-178872 | 7/1989 |
| 2007/0030021 | A1 | 2/2007 | Cowan et al. | JP | 1-209380 | 8/1989 |
| 2008/0157796 | A1* | 7/2008 | Andrews et al. ............ 324/755 | JP | 1-214038 | 8/1989 |
| 2009/0134896 | A1 | 5/2009 | Andrews et al. | JP | 1-219575 | 9/1989 |
| 2009/0153167 | A1* | 6/2009 | Stewart et al. ................ 324/754 | JP | 1-296167 | 11/1989 |
| 2010/0109695 | A1* | 5/2010 | Dunklee ....................... 324/758 | JP | 2-22836 | 1/1990 |
| 2010/0265318 | A1* | 10/2010 | Bewersdorf et al. ............ 348/46 | JP | 2-22873 | 1/1990 |

FOREIGN PATENT DOCUMENTS

| | | | | | |
|---|---|---|---|---|---|
| DE | 29 12 826 | 10/1980 | JP | 2-124469 | 5/1990 |
| DE | 29 51 072 | 7/1981 | JP | 2-135804 | 5/1990 |
| DE | 31 14 466 | 3/1982 | JP | 2-191352 | 7/1990 |
| DE | 31 25 552 | 11/1982 | JP | 2-220453 | 9/1990 |
| DE | 34 26 565 | 1/1986 | JP | 3-67187 | 3/1991 |
| DE | 36 37 549 | 5/1988 | JP | 3-175367 | 7/1991 |
| DE | 41 09 908 | 10/1992 | JP | 3-196206 | 8/1991 |
| DE | 42 23 658 | 1/1993 | JP | 3-228348 | 10/1991 |
| DE | 93 13 420 | 10/1993 | JP | 4-732 | 1/1992 |
| DE | 43 16 111 | 11/1994 | JP | 4-130639 | 5/1992 |
| DE | 94 06 227 | 10/1995 | JP | 4-159043 | 6/1992 |
| DE | 195 41 334 | 9/1996 | JP | 4-206930 | 7/1992 |
| DE | 196 16 212 | 10/1996 | JP | 4-340248 | 11/1992 |
| DE | 195 22 774 | 1/1997 | JP | 5-82631 | 4/1993 |
| DE | 195 42 955 | 5/1997 | JP | 5-157790 | 6/1993 |
| DE | 196 18 717 | 1/1998 | JP | 5-166893 | 7/1993 |
| DE | 197 49 687 | 5/1998 | JP | 52-19046 | 8/1993 |
| DE | 298 09 568 | 10/1998 | JP | 6-71425 | 3/1994 |
| DE | 288 234 | 3/1999 | JP | 6-85044 | 3/1994 |
| DE | 693 22 206 | 4/1999 | JP | 6-102313 | 4/1994 |
| DE | 100 00 324 | 7/2001 | JP | 6-132709 | 5/1994 |
| DE | 202 20 754 | 4/2004 | JP | 6-154238 | 6/1994 |
| EP | 0 087 497 | 9/1983 | JP | 7-5197 | 1/1995 |
| EP | 0 195 520 | 9/1986 | JP | 7-12871 | 1/1995 |
| EP | 0 201 205 | 12/1986 | JP | 7005078 | 1/1995 |
| EP | 0 230 348 | 7/1987 | JP | 7-273509 | 10/1995 |
| EP | 0 230 766 | 8/1987 | JP | 8-35987 | 2/1996 |
| EP | 0 259 163 | 3/1988 | JP | 8-261898 | 10/1996 |
| EP | 0 259 183 | 3/1988 | JP | 8-330401 | 12/1996 |
| EP | 0 259 942 | 3/1988 | JP | 9-127432 | 5/1997 |
| EP | 0 261 986 | 3/1988 | JP | 10116866 | 5/1998 |
| EP | 0 270 422 | 6/1988 | JP | 10-339743 | 12/1998 |
| EP | 0 314 481 | 5/1989 | JP | 11-4001 | 1/1999 |
| EP | 0 333 521 | 9/1989 | JP | 11-23975 | 1/1999 |
| EP | 0 460 911 | 12/1991 | JP | 11-031724 | 2/1999 |
| EP | 0 574 149 | 12/1993 | JP | 2000-329664 | 11/2000 |
| EP | 0 706 210 | 4/1996 | JP | 2001-124676 | 5/2001 |
| EP | 0 505 981 | 6/1998 | JP | 2001-189285 | 7/2001 |
| EP | 0 846 476 | 6/1998 | JP | 2001-189378 | 7/2001 |
| EP | 0 573 183 | 1/1999 | JP | 2002033374 | 1/2002 |
| EP | 0 945 736 | 9/1999 | JP | 2002-164396 | 6/2002 |
| GB | 579665 | 8/1946 | JP | 2002-203879 | 7/2002 |
| GB | 2 014 315 | 8/1979 | JP | 2002-243502 | 8/2002 |
| GB | 2 179 458 | 3/1987 | KR | 2003/0090158 | 11/2003 |
| GB | 2 197 081 | 5/1988 | SU | 843040 | 6/1981 |
| JP | 53-37077 | 4/1978 | SU | 1195-402 | 11/1985 |
| JP | 53-052354 | 5/1978 | SU | 1327023 | 7/1987 |
| JP | 55-115383 | 9/1980 | SU | 1392603 | 4/1988 |
| JP | 56-7439 | 1/1981 | WO | WO 80/00101 | 1/1980 |
| JP | 56-88333 | 7/1981 | WO | WO 86/07493 | 12/1986 |
| JP | 56-91503 | 7/1981 | WO | WO 89/04001 | 5/1989 |
| JP | 57-75480 | 5/1982 | WO | WO 94/10554 | 5/1994 |
| JP | 57-163035 | 10/1982 | WO | WO 98/07040 | 2/1998 |
| JP | 57-171805 | 10/1982 | WO | WO 00/73905 | 12/2000 |
| JP | 58-130602 | 8/1983 | WO | WO 01/07207 | 2/2001 |
| JP | 59-4189 | 1/1984 | WO | WO 01/69656 | 9/2001 |
| JP | 60-5462 | 4/1984 | WO | WO 2004/049395 | 6/2004 |
| JP | 61-142802 | 6/1986 | WO | WO 2004/065944 | 8/2004 |
| JP | 62-011243 | 1/1987 | WO | WO 2004/079299 | 9/2004 |
| JP | 62-51235 | 3/1987 | WO | WO 2005/062025 | 7/2005 |
| JP | 62-98634 | 5/1987 | WO | WO 2006/083581 | 8/2006 |
| JP | 62-107937 | 5/1987 | | | |
| JP | 62-239050 | 10/1987 | | | |
| JP | 62-295374 | 12/1987 | | | |
| JP | 63-108736 | 5/1988 | | | |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description, date unknown.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12, date unknown.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213, date unknown.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5, date unknown.

Cascade Microtech, "Model 42/42D Microwave Probe Station Instruction Manual, Electrical Operation," pp. 4-1-4-42, Copyright 1987.

Inter-Continental Microwave, "Microwave Semiconductor Chip Measurements using the HP 8510B TRL-Calibration Technique," Application Note: 101, 12 pages, date unknown.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog," 39 pages, date unknown.

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8, date unknown.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measurement Technology: A Wafer Chuck for Use Between −196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68th Street, Mercer Island, Washington 98040, date unknown.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages, date unknown.

Mark S. Boguski & Martin W. McIntosh, "Biomedical informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages, date unknown.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9, date unknown.

The Micromanipulator Company, Inc., "Accessories: Hot and Hot/Cold Chucks, Integrated Dry environments, Triaxial chucks, Integrated Shielded and Dark environments, Probe Card Holders," p. 8, date unknown.

Cascade Microtech, "Advanced On-Wafer Device Characterization Using the Summit 10500," pp. 2-20, date unknown.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard, date unknown.

Temptronic Corporation, "Application Note 1 Controlled Environment Enclosure for low temperature wafer probing in a moisture-free environment," 2 pages, date unknown.

*Cascade Microtech, Inc.* vs. *Micromanipulator Company, Inc.*, "Deposition of Harry F. Applebay," United States District Court for the District of Oregon, Lead Case No. 97-479-AI.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

Barbara Marte, Senior Editor, "Nature insight Proteomics," Nature vol. 422, Mar. 13, 2003 pp. 191-194.

QingQing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Deming Xu, Liping Liu, & Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, & R. N. Clarke, "The Measurement of the Properties of Materials," Proceedings of the IEEE, vol. 74, No. 1, Jan. 1986, pp. 183-199.

M.S. Venkatesh & G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, & Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al>, "Multimode TRL—A New Concept in Microwave Measurements: Theory and Experimental Verification," IEEE Transactions on Microwave Teory and Techniques, vol. 46, No. 5, May 1998, pp. 536-542.

Roberto Tinti, Franz Sischka, & Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, & Daniel E. Prober, "Optical antenna: towards a unity efficiency near-field optical probe," Appl. Phys. Lett. 70 (11), Mar. 17, 1997 American Institute of Physics, pp. 1354-1356.

Cascade Microtech, "Probe heads care and cleaning of coaxial input microwave probes," Microwave Probe Care and Cleaning, Instruction Manual, Copyright 1990.

International Search Report for PCT/US/06/16238 mailed Feb. 28, 2007.

Written Opinion of the International Searching Authority for PCT/US01/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Cohn, S, "Properties of Ridge Wave Guide," Proceedings of the I.R.E., Aug. 1947, pp. 783-788.

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF) Software," MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W-Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

* cited by examiner

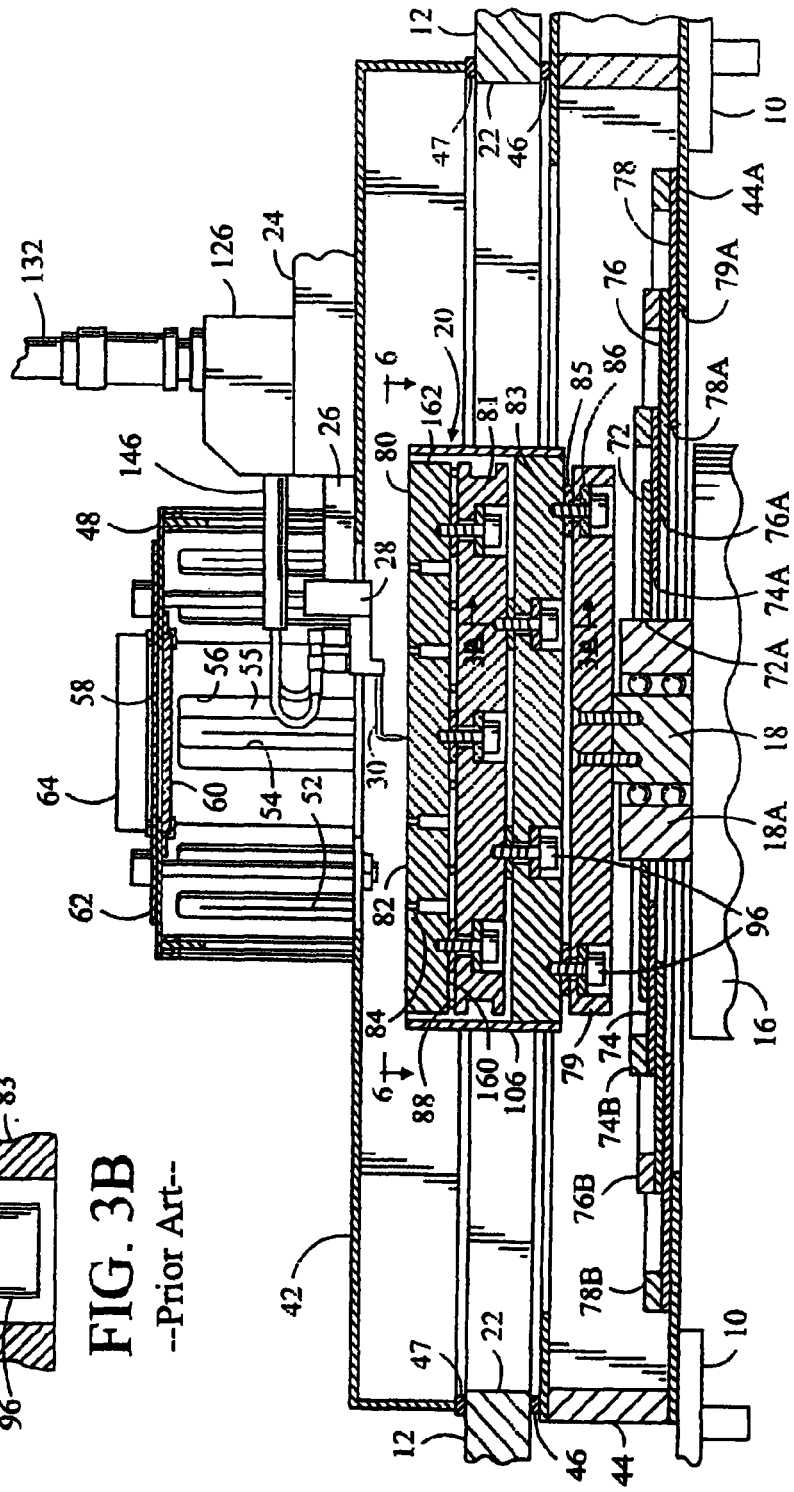
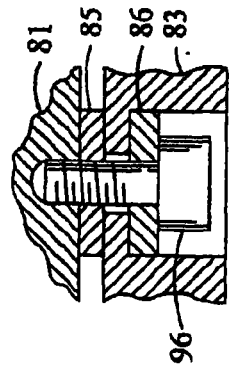
FIG. 3A –Prior Art–
FIG. 3B –Prior Art–

SYSTEM FOR TESTING SEMICONDUCTORS

CROSS-REFERENCE TO RELATED APPLICATIONS

This application is a continuation of U.S. patent application Ser. No. 11/335,069, filed Jan. 18, 2006, now U.S. Pat. No. 7,656,172; which application claims the benefit of U.S. Provisional App. No. 60/648,952, filed Jan. 31, 2005.

BACKGROUND OF THE INVENTION

The present invention relates to a system that includes an imaging device for effectively positioning a probe for testing a semiconductor wafer.

Processing semiconductor wafers include processes which form a large number of devices within and on the surface of the semiconductor wafer (hereinafter referred to simply as "wafer"). After fabrication these devices are typically subjected to various electrical tests and characterizations. In some cases the electrical tests characterize the operation of circuitry and in other cases characterize the semiconductor process. By characterizing the circuitry and devices thereon the yield of the semiconductor process may be increased.

In many cases a probe station, such as those available from Cascade Microtech, Inc., are used to perform the characterization of the semiconductor process. With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces. Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3A and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3A, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3A and 3B, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3A, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) Connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

In order to position probes for testing semiconductors, typically on a conductive pad, a microscope may be used. The process for positioning the microscope on the semiconductor is time consuming and laborious. A wide angle field of view objective lens for the microscope is selected and installed. Then the probe is brought into the general field of view of the microscope with the semiconductor thereunder with the objective lens focused on the upper region of the probe. Hence, the upper region of the probe farther away from the probe tip is generally in focus. The lower regions of the probe and the probe tip are generally not in focus due to the limited depth of field of the objective lens. Also, at this point only the larger features of the semiconductor are discernable. The zoom of the microscope may be increased by the operator and the microscope shifted to focus on a further distant part of the probe which provides a narrower field of view so that a middle region of the microscope is in focus. Hence, the upper region of the probe and the probe tip region are generally not in focus when viewing the middle region of the probe due to the limited depth of field of the objective lens. Also, at this point smaller regions of the semiconductor are discernable. The zoom of the microscope may be increased by the operator and the microscope shifted to fucus on the probe tip which provides an increasingly narrower field of view so that the probe tip region is generally in focus together with the corresponding devices under test. The lower regions of the probe and the upper regions of the probe are generally not in focus when viewing the probe tip region of the probe due to the limited depth of field of the objective lens.

While it would appear to be straightforward to position a probe tip on a desirable device under test, it turns out that this is a burdensome and difficult task. Often when zooming the microscope the probe goes out of focus and when the microscope is refocused the probe is not within the field of view. When this occurs there is a need to zoom out to a wider field of view and restart the process. Also, when there are several devices in close proximity to one another and a wide field of view is observed, it is difficult to discern which device under test the probe tip is actually proximate. As the microscope is zoomed and an increasingly narrow field of view it tends to be difficult to determine which device the probe is actually testing among a set of closely spaced devices. In many cases, the operator will desire to use a higher magnification microscope, which requires the microscope to be retracted, the objective lens changed, and the microscope moved back into position. Unfortunately, if any movement of the wafer relative to the probe occurs due to even slight vibration, the probe will not longer be in close alignment. Thus, the objective lens will typically be changed back to one with a lower magnification and the process started all over again.

BRIEF DESCRIPTION OF THE SEVERAL VIEWS OF THE DRAWINGS

FIG. 3A is a partially sectional and partially schematic front view of the probe station of FIG. 1.

FIG. 3B is an enlarged sectional view taken along line 3B-3B of FIG. 3A.

DETAILED DESCRIPTION OF PREFERRED EMBODIMENT

Figure 2A:
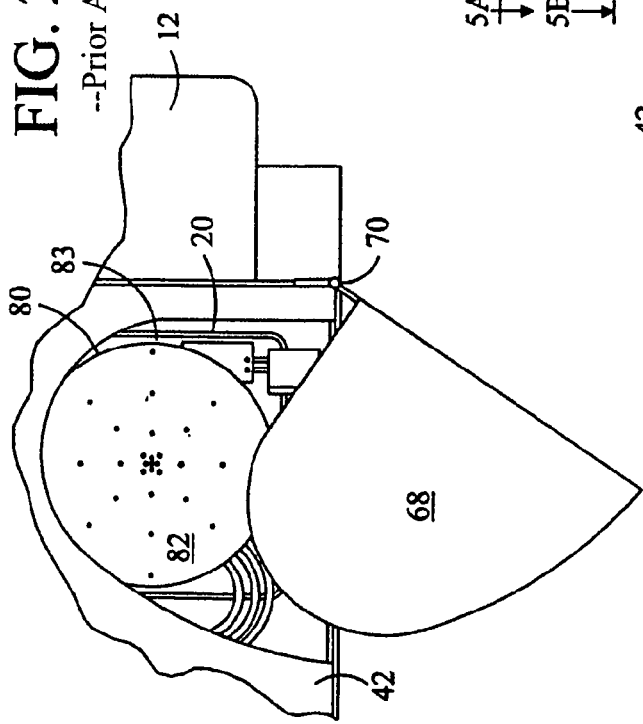
FIG. 2A is a partial top view of the wafer probe station of FIG. 1 with the enclosure door shown partially open.
Figure 1:
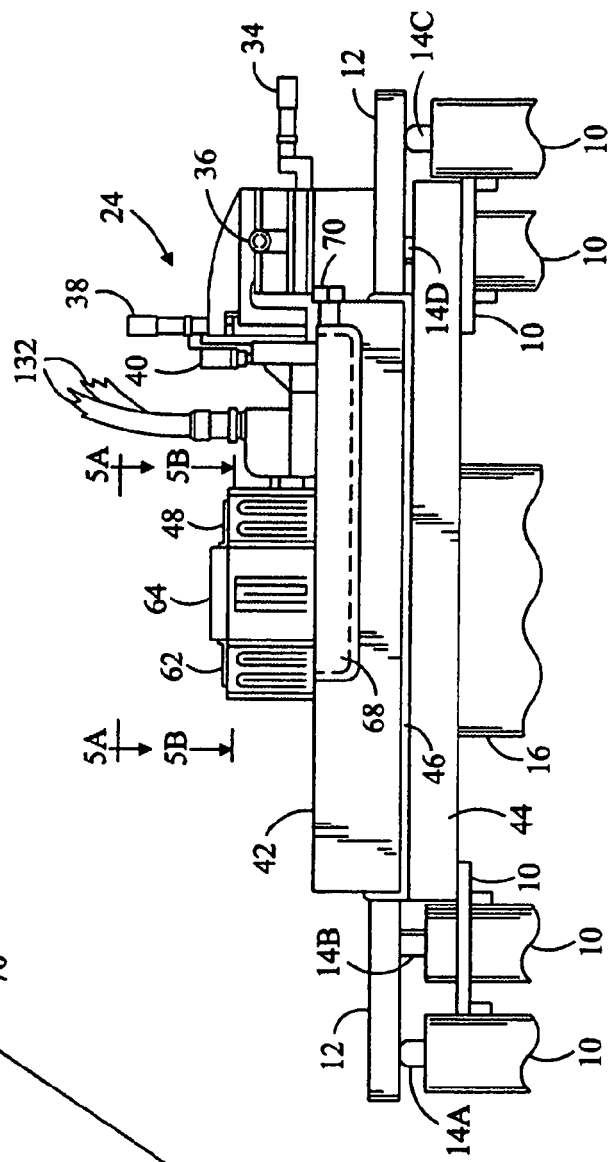
FIG. 1 is a partial front view of an exemplary embodiment of a wafer probe station constructed in accordance with the present invention.
Figure 2B:
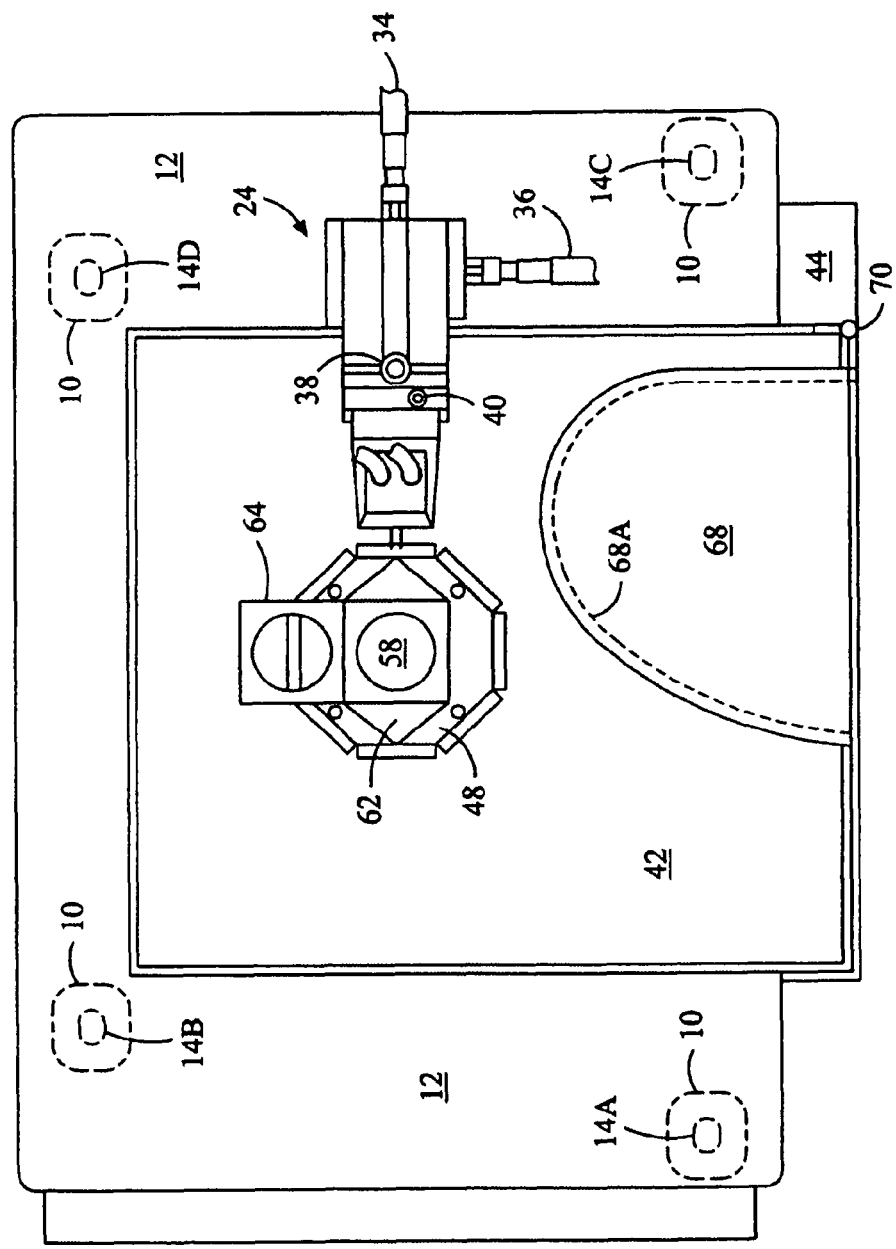
FIG. 2 is a top view of the wafer probe station of FIG. 1.
Figure 4:
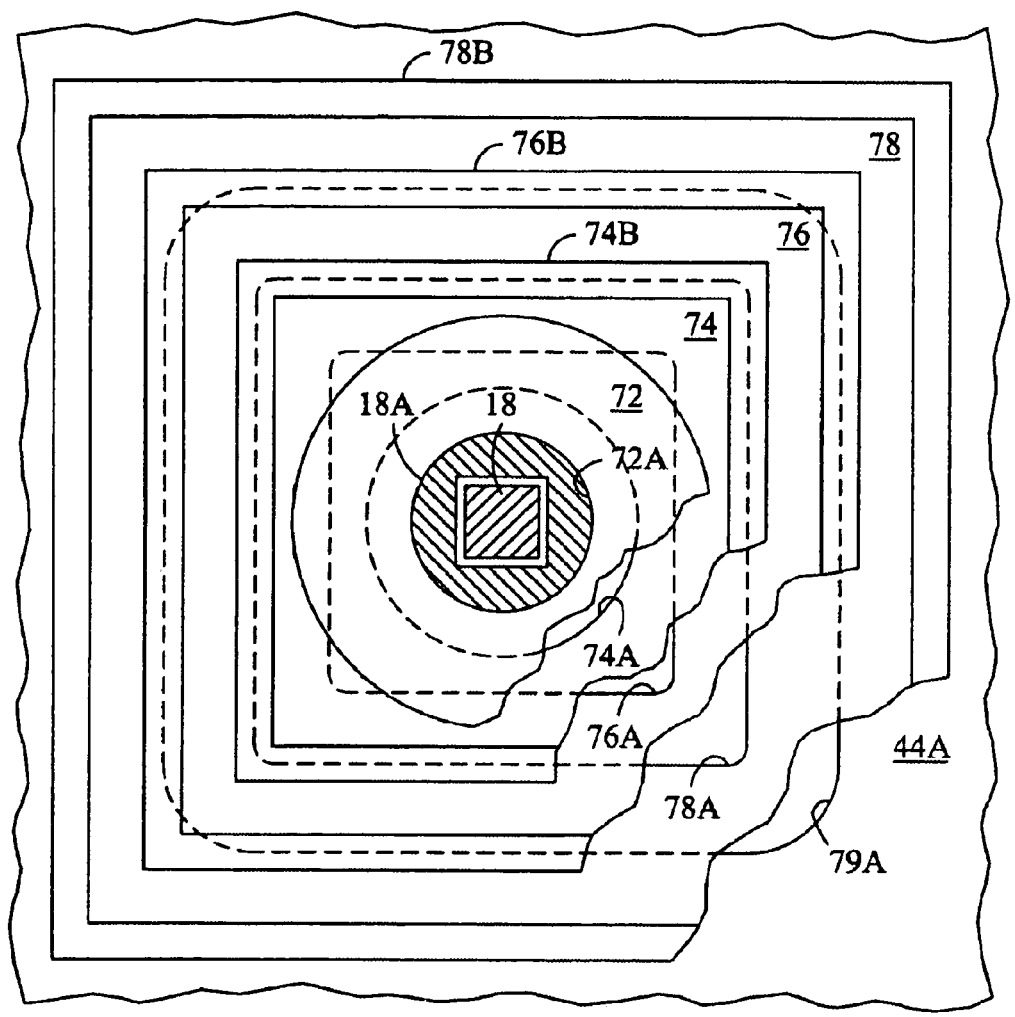
FIG. 4 is a top view of the sealing assembly where the motorized positioning mechanism extends through the bottom of the enclosure.
Figure 5A:
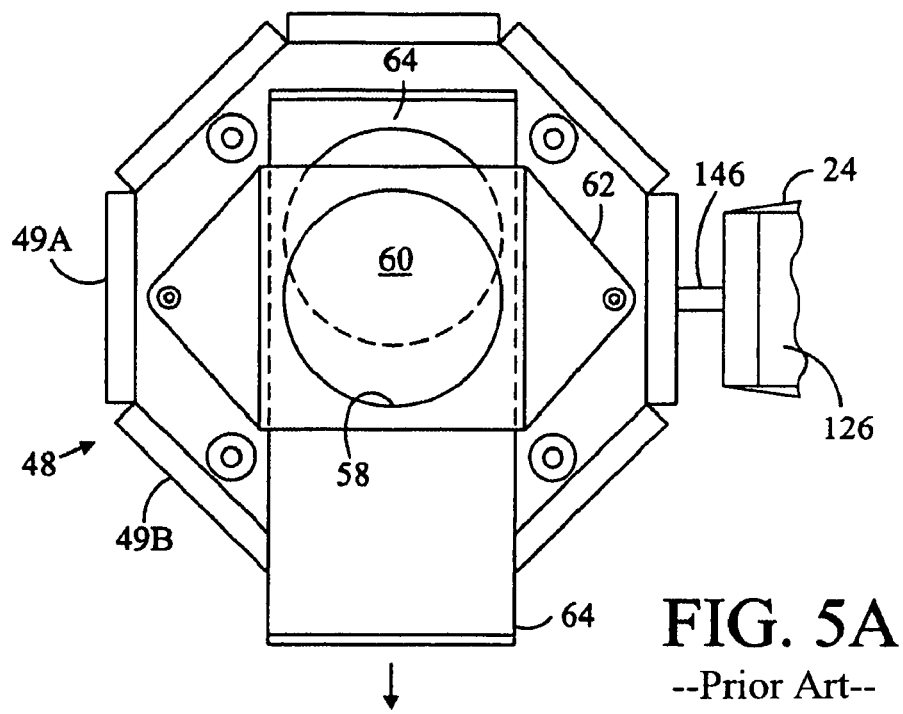
FIG. 5A is an enlarged top detail view taken along line 5A-5A of FIG. 1.
Figure 5B:
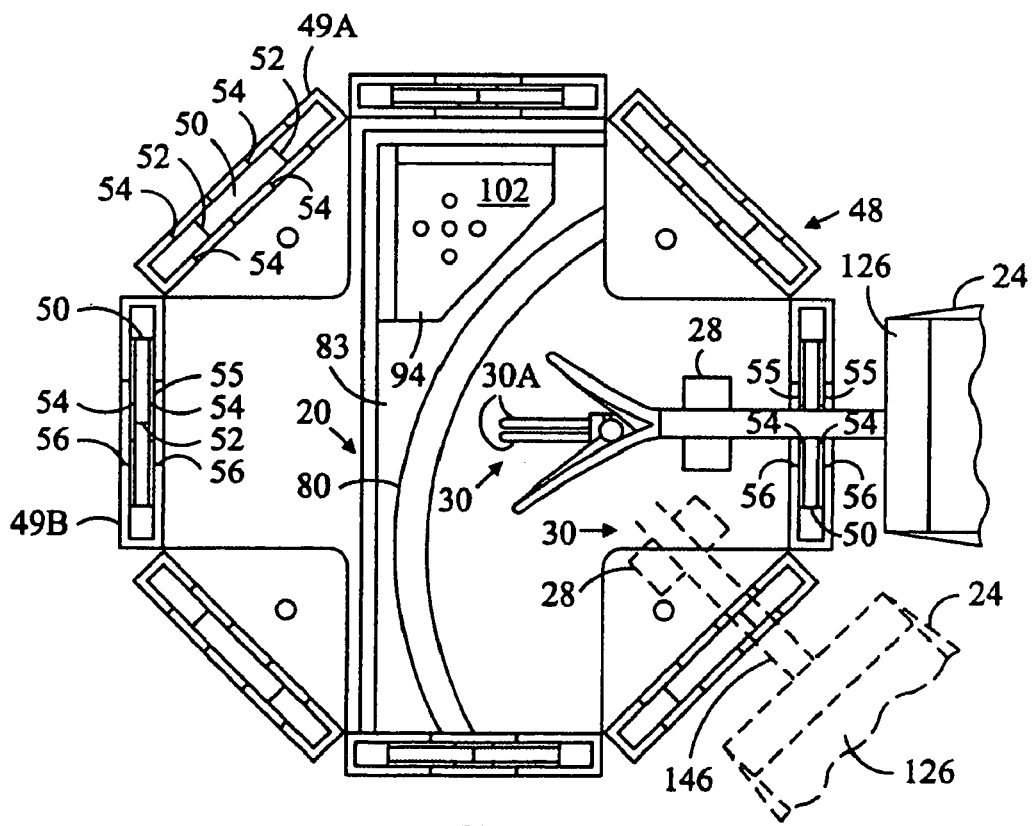
FIG. 5B is an enlarged top sectional view taken along line 5B-5B of FIG. 1.
Figure 6:
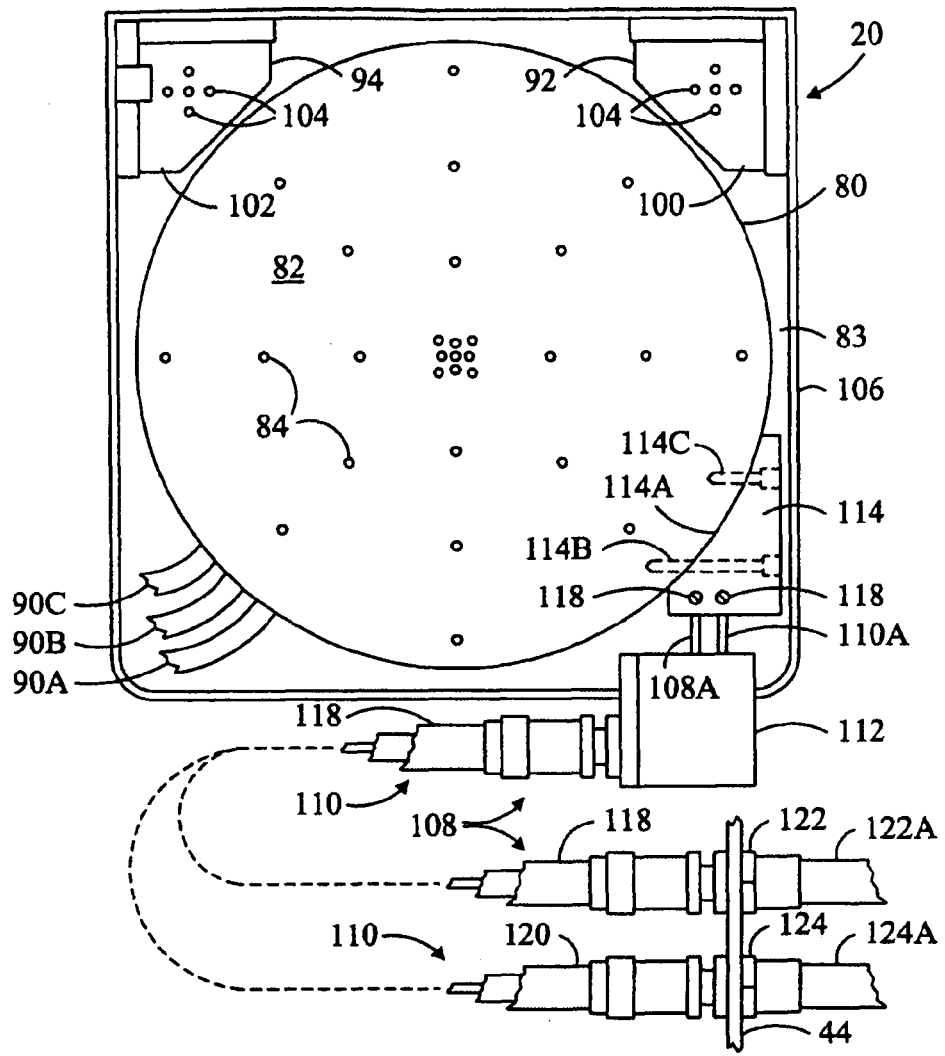
FIG. 6 is a partially schematic top detail view of the chuck assembly, taken along line 6-6 of FIG. 3A.
Figure 7:
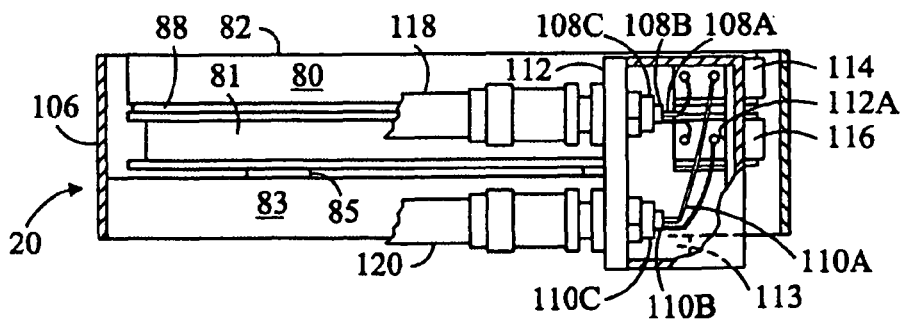
FIG. 7 is a partially sectional front view of the chuck assembly of FIG. 6.
Figure 8:
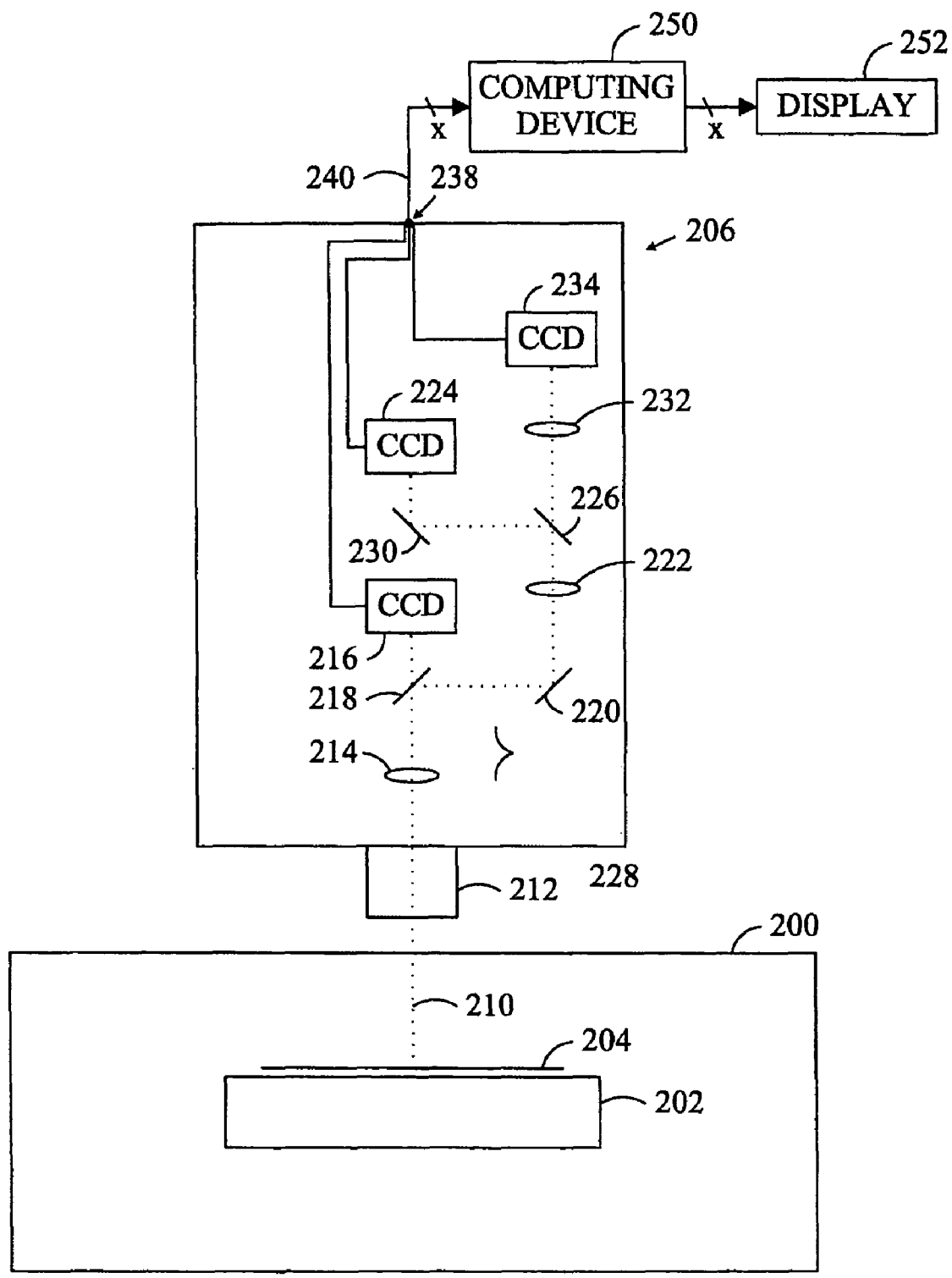
FIG. 8 illustrates a probing system together with a microscope.

Referring to FIG. 8, a probing system may include a probing environment 200 having a support 202 for a wafer 204 together with a microscope 206. The microscope 206 preferably includes a single optical path 210 that passes through an objective lens 212. The optical path may pass through a first lens 214 which images the light from the device under test on a first imaging device 216, such as a charge coupled device. An optical splitting device 218 may be used to direct a portion 220 of the light from being imaged on the first imaging device 216. The light 220 may be reflected by a mirror 221 and pass through a second lens 222. An optical splitting device 226 and mirror 230 may be used to direct a portion 228 of the light being imaged on a second imaging device 224. Accordingly, the light from the second lens 222 images the light on a second imaging device 224. The light passing through the optical splitting device 226 passes through a lens 232 and is imaged on a third imaging device 234.

The first imaging device 216 images the device under test at a first magnification based upon the objective lens 212 and the first lens 214. Normally the first imaging device 216 images a relatively wide field of view. The second imaging device 224 images the device under test at a second magnification based upon the objective lens 212, the first lens 214, and the second lens 222. Normally the second imaging device 216 images a medium field of view, being of a greater magnification than the relatively wide field of view of the first imaging device 216. The third imaging device 234 images the device under test at a third magnification based upon the objective lens 212, the first lens 214, the second lens 222, and the third lens 232. Normally the third imaging device 234 images a narrow field of view, being of a greater magnification than the medium field of view of the second imaging device 224. In some embodiments, three or more imaging devices may be used. In other embodiments, two or more imaging devices may be used. In yet other embodiments, a single imaging device may be used. In some cases, the microscope with a single imaging device may include mechanisms to provide variable magnification. Also, in some cases the microscope with a single imaging device may use all of the imaging sensor for the wide field of view, a smaller region of the imaging sensor for a narrower field of view, and so forth.

With a wide field of view for the first imaging device 216, the large features of the device under test may be observed. With the narrower field of view of the second imaging device 224, the smaller features of the device under test may be observed. With the increasingly narrower field of view of the third imaging device 234, the increasingly smaller features of the device under test may be observed. As it may be observed, the three imaging devices provide different fields of view of the same device.

The microscope 206 includes an output 238 connected to a cable 240, such as a gigabit network cable. Each of the imaging devices 216, 224, 234, provides a video signal (comprising a sequence of sequential frames in most cases) to the cable 240. The multiple video signals in the cable 240 are preferably simultaneous video sequences captured as a series of frames from each of the respective imaging devices 216, 224, 234. In addition, the video signals are preferably simultaneously transmitted, albeit they may be multiplexed within the cable 240. In some embodiments the microscope 206 may have multiple outputs and multiple cables, with one for each imaging device and video signal, it is preferable that the microscope 206 includes a single output for the video signals.

The multiple video signals transmitted within the cable 240 are provided to a computing device 250. The input feeds in many cases are provided to a graphics card connected to an AGP interconnection or PCI interconnection. Accordingly, the computing device receives a plurality of simultaneous video streams. Each of the video streams may be graphically enhanced, as desired, such as by sharpening and using temporal analysis to enhance details. The three video feeds may be combined into a single composite video feed with a portion of each video feed being illustrated on the composite video feed and provided to a single display for presentation to the viewer. In this case, each of the viewers would be able to observe multiple video feeds on a single display. The video signal may likewise be provided to multiple different displays.

Figure 9:
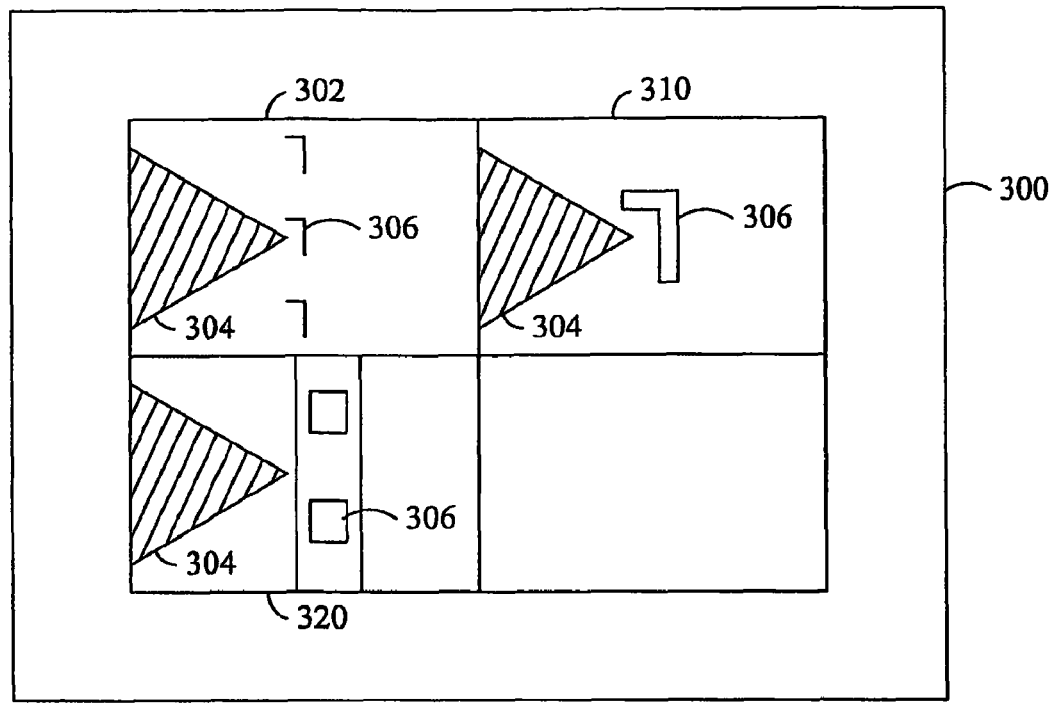
FIG. 9 illustrates a graphical user interface.
Figure 10:
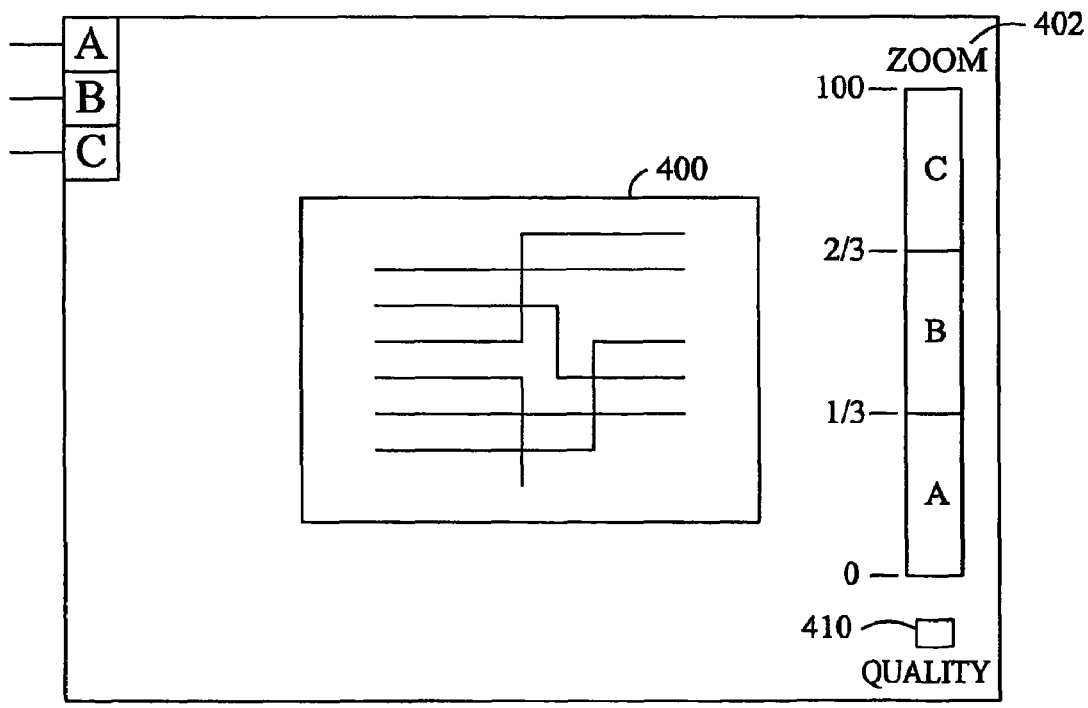
FIG. 10 illustrates another graphical user interface.

Referring to FIG. 9, it is desirable to view the probe 304 and device under test 306 in a first window 302 of a display 300 using the first imaging device 216. By using the first imaging device 216 a relatively wide field of view may be observed of the probe 304 and the device under test 306. The probe 304 may be generally aligned with the device under test 306. This permits the operator to view a large region of devices under test and align the probe 304 with the desired device under test out of a group of devices under test.

It is further desirable to view the probe 304 and device under test 306 in a second window 310 of a display 300 using the second imaging device 224. By using the second imaging device 224 a narrower field of view may be observed of the probe 304 and the device under test 306. The details of the device under test 306 may be observed in the second window 310 which permits the probe 304 to be more accurately aligned with the device under test 306. This permits the operator to view a large region of devices under test and align the probe 304 using the first window 302 and to view a narrower region of the device under test to align the probe 304 with the second window 310. In this manner, the operator can roughly guide the probe using the first window 302 and then further guide the probe more accurately using the second window 310, without the need to zoom in and out which tends to cause the microscope to go out of focus.

It is still further desirable to view the probe 304 and device under test 306 in a third window 320 of a display 300 using the third imaging device 234. By using the third imaging device 234 an even narrower field of view may be observed of the probe 304 and the device under test 306. The details of the device under test 306 may be observed in the third window 320 which permits the probe 304 to be more accurately aligned with the device under test 306. This permits the operator to view a large region of devices under test and align the probe 304 using the first window 302, to view a narrower region of the device under test to align the probe 304 with the second window 310, and to further accurately position the probe 304 on the device under test 306 using the third window 320. In this manner, the operator can roughly guide the probe using the first window 302, further guide the probe more accurately using the second window 310, and then guide the probe to the device under test using the third window 320, without the need to zoom in and out to maintain the focus of the probe. Additional windows and imaging devices may be used, as desired. In some embodiments, the video for each of the windows (two or more) may be provided by a single imaging device, two imaging devices, or three or more imaging devices.

When operating the device, typically the probe 304 and the device under test 306 comes into view in the first window 302. Thereafter, as the operator moves the probe 304 closer to the device under test 306, the probe 304 comes into view in the second window 310. The operator may thus move the probe 304, while simultaneously viewing the probe 304 and the device under test 306 in the second window 310. Then, as the operator moves the probe closer to the device under test 306, the probe 304 comes into view in the third window 320. The operator may thus move the probe 304, while simultaneously viewing the probe 304 and the device under test 306 in the third window 320, such that the probe is positioned on the device under test. Accordingly, the x, y, and z tip of the probe 304 may be effectively aligned with the device under test 306.

The system may include a zoom 402 feature for a window 400 to zoom in and out on the device under test. The range of the zoom may be scaled from 0 to 100, with zero being the widest angle and 100 being the narrowest angle. The first imaging device 216 may be used as the basis upon which to provide a digital zoom for the zoom of images within range A. The 'native' imaging mode of the first imaging device 216 is at the zero point. The second imaging device 224 may be used as the basis upon which to provide a digital zoom for the zoom of images within range B. The 'native' imaging mode of the second imaging device 224 may be at the ⅓ point. The third imaging device 234 may be used as the basis upon which to provide a digital zoom for the zoom of images within range C. The 'native' imaging mode of the third imaging device 234 may be at the ⅔ point. Using a digital zoom based upon the best available image quality (next lower native mode) provides a higher quality digital zoom, such as using the third imaging device 234 for a digital zoom of 80%. The 'native' mode generally refers to a non-digitally zoomed image from the imaging device.

In the event that the operator desires to only observe the best quality of images, a quality mode 410 may be selected. In the quality mode of operation the available zooms may be set at 0, ⅓, and ⅔ which represent that 'native' non-digitally zoomed images from the respective imaging devices. Also, some imaging devices may have multiple 'native' non-digitally zoomed images depending on the sampling used to acquire the images. In addition, other selected zooms may be provided, such as for example, ½ way in each of the A, B, and C ranges. In general, the zoom feature 402 may be limited to less than all of the available digital zooms to maintain image quality that may otherwise not result from excess digital zooming. For example, there may be one or more regions of the zoom range of 5% or more (based upon a scale of 0 to 100) each that are not selectable by the operator.

Figure 11:
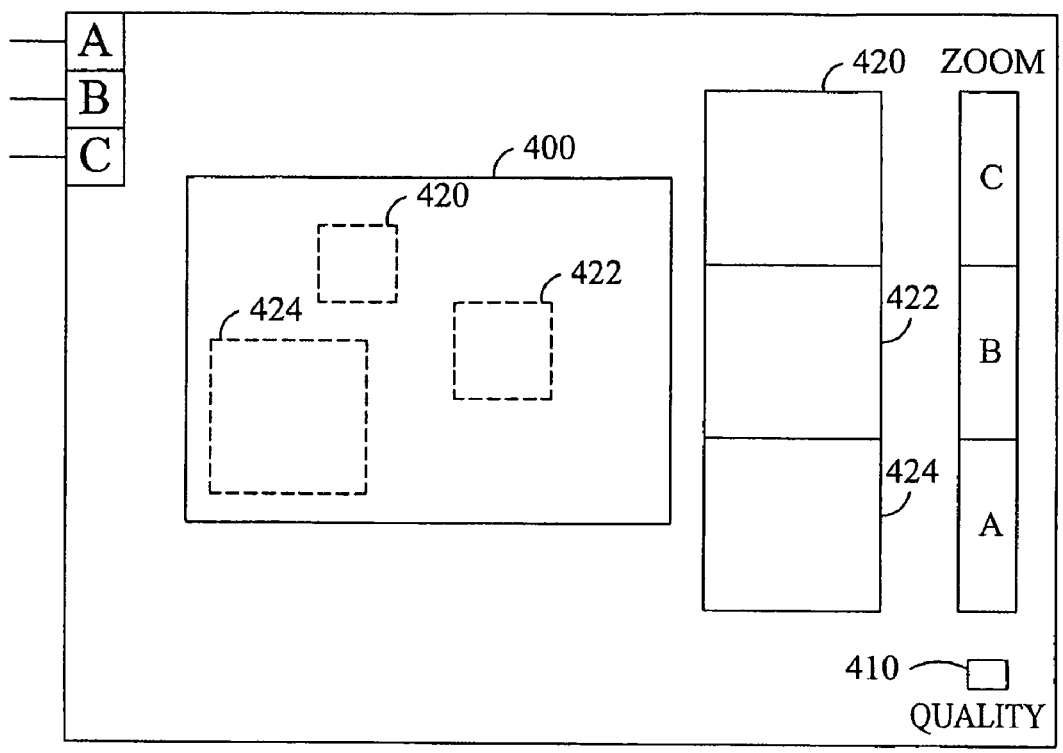
FIG. 11 illustrates another graphical user interface.

Referring to FIG. 11, the system may also include multiple windows 420, 422, 424, each of which may be a selected portion of the window 400 at a selected zoom. Window 400 may be any zoom but is preferably the widest view. In this manner, the operator may be able to simultaneously observe multiple regions of the device under test, each of which may be associated with a different probe testing a different device under test. In this case the principal window 400 may be updated at a video frame rate and each of the windows 420, 422, 424 may likewise be updated at the video frame rate. In some embodiments, the images may be updated at a rate slower than the video frame rate, if desired.

Figure 12:
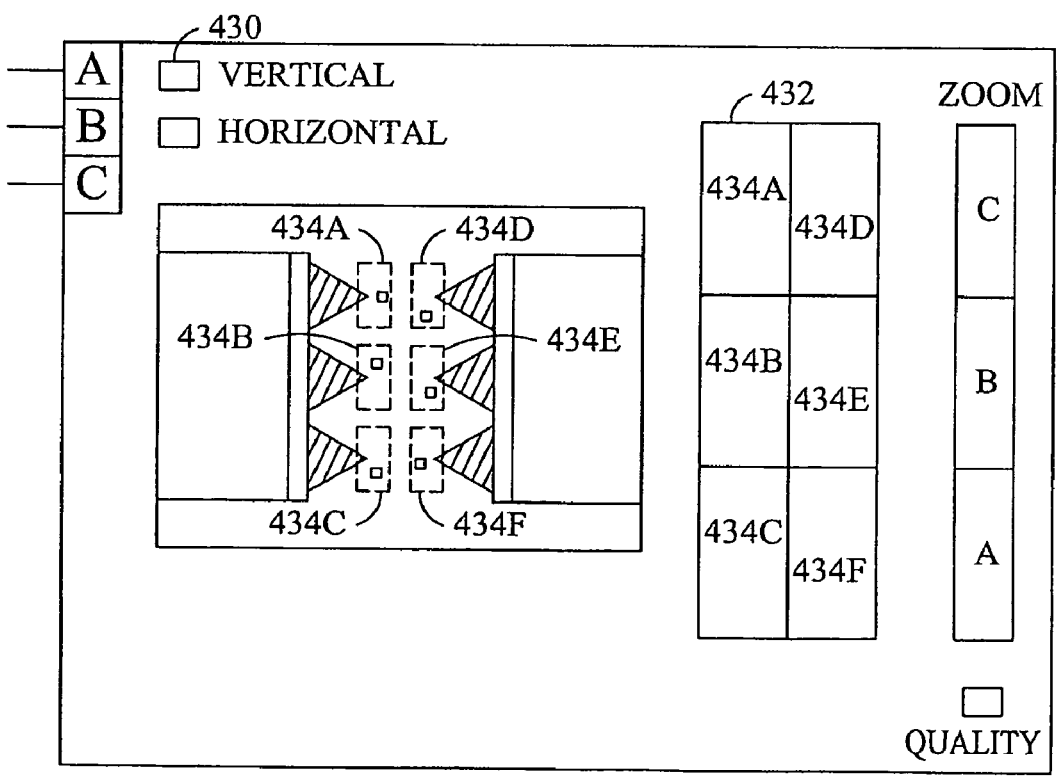
FIG. 12 illustrates another graphical user interface.

In a lot of circumstances the devices under test are arranged in a typical array of 3×2 with each three aligned pads being ground-signal-ground. Referring to FIG. 12, it is preferable that a vertical mode 430 may be selected that presents a set of windows 432 that are arranged in a vertical arrangement of 3×2 windows. Typically window 434A would relate to a ground path of a left probe, window 434B would relate to a signal path of the left probe, window 434C would relate to a ground path of the left probe, window 434D would relate to a ground path of a right probe, window 434E would relate to a signal path of the right probe, and window 434F would relate to a ground path of the right probe. In this manner, the windows 434A-F are oriented in a similar orientation to the pair of probes being used on the devices under test.

Figure 13:
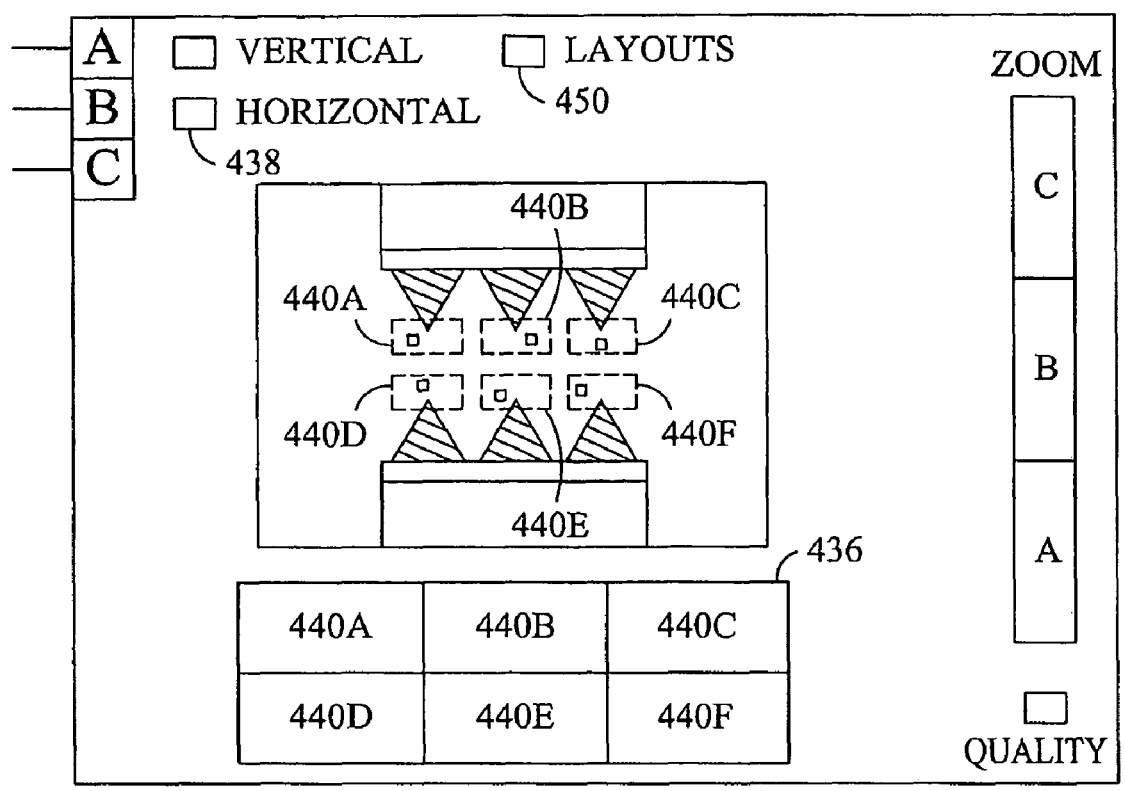
FIG. 13 illustrates another graphical user interface.

In a lot of circumstances the devices under test are arranged in a typical array of 2×3 with each three aligned pads being ground-signal-ground. Referring to FIG. 13, it is preferable that a horizontal mode 438 may be selected that presents a set of windows 436 that are arranged in a vertical arrangement of 2×3 windows. Typically window 440A would relate to a ground path of a upper probe, window 440B would relate to a signal path of the upper probe, window 440C would relate to a ground path of the upper probe, window 440D would relate to a ground path of a lower probe, window 440E would relate to a signal path of the lower probe, and window 440F would relate to a ground path of the lower probe. In this manner, the windows 440A-F are oriented in a similar orientation to the pair of probes being used on the devices under test.

In some cases the operator may need a particular configuration of windows to correspond with a particular probing configuration of probe. In this case, the user may select layout 450, which permits the user to layout a set of windows on the screen in any desirable configuration. In addition, the user may save and retrieve these custom layouts for future use.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probing system for a device under test comprising:
   (a) an objective lens sensing said device under test through a single optical path;
   (b) a first imaging device sensing a first video sequence of said device under test at a first magnification from said single optical path;
   (c) a second imaging device sensing a second video sequence of said device under test at a second magnification from said single optical path;
   (d) a third imaging device sensing a third video sequence of said device under test at a third magnification from said single optical path;
   (e) providing a video signal to a display that simultaneously presents said first video signal, said second video signal, and said third video signal to a monitor.

2. The probing system of claim 1 wherein said first video signal is presented in a first window, said second video signal is presented in a second window, and said third video signal is presented in a third window.

3. A probing system for a device under test comprising:
   (a) an objective lens sensing said device under test through a single optical path;
   (b) a first imaging device sensing a first video sequence of said device under test at a first magnification from said single optical path;
   (c) a second imaging device sensing a second video sequence of said device under test at a second magnification from said single optical path;
   (d) simultaneously providing said first video sequence, and said second video sequence, to a display;
   (e) wherein the magnification of said first video signal is selectable and the magnification of said second video signal is selectable.

4. The probing system of claim 3 wherein said magnification of said first video signal includes a range of at least 5% of the total range of magnification that is not selectable by said user.

5. A probing system for a device under test comprising:
   (a) an objective lens sensing said device under test through a single optical path;
   (b) an imaging device sensing a video sequence of said device under test at a first magnification from said single optical path;
   (c) a display displaying the video sequence in a first window; said display displaying a region of said first video sequence in a second window.

6. The probing system of claim 5 wherein said video displayed in said second window is from another imaging device at a second magnification from said single optical path.

7. A method for displaying video for a probing system comprising:
   (a) receiving a video signal of a device under test;
   (b) presenting said video signal in a first window on a display;

(c) simultaneously presenting a first portion of said video signal in a second window on a portion of said display; and
(d) simultaneously presenting a second portion of said video signal in a third window on a portion of said display;
(e) wherein a part of said video signal comprising the first portion and a part of said video signal comprising said second portion are selectable by an operator.

8. The method of claim 7 further comprising a third portion of said video signal presented in a fourth window, a fourth portion of said video signal presented in a fifth window, a fifth portion of said video signal presented in a sixth window, and a sixth portion of said video signal presented in a seventh window.

9. The method of claim 8 wherein said second, third, fourth, fifth, sixth, and seventh windows are arranged in a 2×3 format.

10. The method of claim 8 wherein said second, third, fourth, fifth, sixth, and seventh windows are arranged in a 3×2 format.

* * * * *